(12) United States Patent
Noguchi

(10) Patent No.: US 8,710,589 B2
(45) Date of Patent: Apr. 29, 2014

(54) SEMICONDUCTOR DEVICE

(71) Applicant: Renesas Electronics Corporation, Kawasaki (JP)

(72) Inventor: Ko Noguchi, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/668,266

(22) Filed: Nov. 3, 2012

(65) Prior Publication Data

US 2013/0153959 A1      Jun. 20, 2013

(30) Foreign Application Priority Data

Nov. 4, 2011   (JP) ................................. 2011-241938

(51) Int. Cl.
   *H01L 23/62*           (2006.01)
(52) U.S. Cl.
   USPC .................... 257/355; 257/358; 257/E29.014
(58) Field of Classification Search
   USPC ........... 257/355, 356, 357, 358, 363, E29.014
   See application file for complete search history.

(56) References Cited

U.S. PATENT DOCUMENTS

| 5,724,219 | A | 3/1998 | Narita |
| 6,583,972 | B2 | 6/2003 | Verhaege et al. |
| 7,646,063 | B1 | 1/2010 | Boyd et al. |
| 8,310,010 | B2 * | 11/2012 | Okushima ..................... 257/355 |

FOREIGN PATENT DOCUMENTS

| JP | 2002-76279 A | 3/2002 |
| WO | WO 01/97358 A1 | 12/2011 |

OTHER PUBLICATIONS

Extended European Search Report issued Jan. 13, 2013, in European Patent Application No. 12190535.0.

* cited by examiner

*Primary Examiner* — Hoai V Pham
(74) *Attorney, Agent, or Firm* — Miles & Stockbridge P.C.

(57) ABSTRACT

An allowable current amount of a ballast resistance is increased without increasing the width of the ballast resistance. At least one of resistances included in a ballast resistance has a first resistance and a second resistance. The first resistance extends in a first direction (X direction in FIG. 1) in which current flows in a protection element. The second resistance element is coupled in parallel to the first resistance element and extends in the first direction. The second resistance element and the first resistance element are located on the same straight line.

11 Claims, 28 Drawing Sheets

SEMICONDUCTOR DEVICE

CROSS-REFERENCE TO RELATED APPLICATIONS

The disclosure of Japanese Patent Application No. 2011-241938 filed on Nov. 4, 2011 including the specification, drawings and abstract is incorporated herein by reference in its entirety.

BACKGROUND

The present invention relates to a semiconductor device including a protection element and a ballast resistance for preventing breakdown due to over-current or over-voltage such as electrostatic discharge (ESD).

A ballast resistance may be provided to a protection element that protects an internal circuit from over current and over-voltage. It is known that the ballast resistance has an effect to improve discharge performance of the protection element by preventing current flowing in the protection element from concentrating in a certain portion and improving the uniformity of the current.

On the other hand, Japanese Unexamined Patent Application Publication No. 2002-76279 discloses the technique described below. First, an insulating region is formed in a silicon layer of an SOI substrate and an island-shaped semiconductor region is formed inside the insulating region. The semiconductor region has a crooked pattern in a plan view. One end of the semiconductor region is a $p^+$ region and the other end is an $n^+$ region. The other region of the semiconductor region is an n region. In other words, the semiconductor region not only functions as a diode, but also functions as a resistance by the n region. A plurality of the semiconductor regions are arranged in a matrix form and the semiconductor regions are coupled in parallel.

SUMMARY

When an over-current by ESD flows in the protection element, if a certain amount or more of current flows, the protection element is broken. The certain amount of current is referred to as an allowable current amount. The allowable current amount is determined with respect to each of the protection element and the ballast resistance. When the allowable current amount of the ballast resistance is smaller than that of the protection element, the ballast resistance may be broken earlier than the protection element. Therefore, it is preferable that the allowable current amount of the ballast resistance is set to be larger than that of the protection element. The inventors of the present invention studied about increasing the allowable current amount by enlarging the width of the ballast resistance. However, in this case, the area of the ballast resistance increases. From such a background, the inventors thought that the allowable current needed to be increased without enlarging the width of the ballast resistance.

According to one aspect of the present invention, a semiconductor device is provided which includes a protection element and a ballast resistance coupled to the protection element and in which at least one of a plurality of resistances included in the ballast resistance includes a plurality of first resistance elements extending in a first direction in which current flows in the protection element and a second resistance element which is coupled in parallel to the first resistance element and which extends in the first direction and the second resistance element and the first resistance element extend on the same straight line.

In the aspect of the present invention, at least one of resistances included in the ballast resistance has the first resistance element and the second resistance element. The first resistance element and the second resistance element are coupled in parallel to each other. Therefore, it is possible to increase the allowable current amount of the ballast resistance. The first resistance element and the second resistance element extend in the first direction in which current flows in the protection element. The second resistance element and the first resistance element are located on the same straight line, so that the width of the ballast resistance does not increase. Therefore, according to the aspect of the present invention, it is possible to increase the allowable current amount without increasing the width of the ballast resistance.

According to the aspect of the present invention, it is possible to increase the allowable current amount without increasing the width of the ballast resistance.

DETAILED DESCRIPTION

Figure 1:
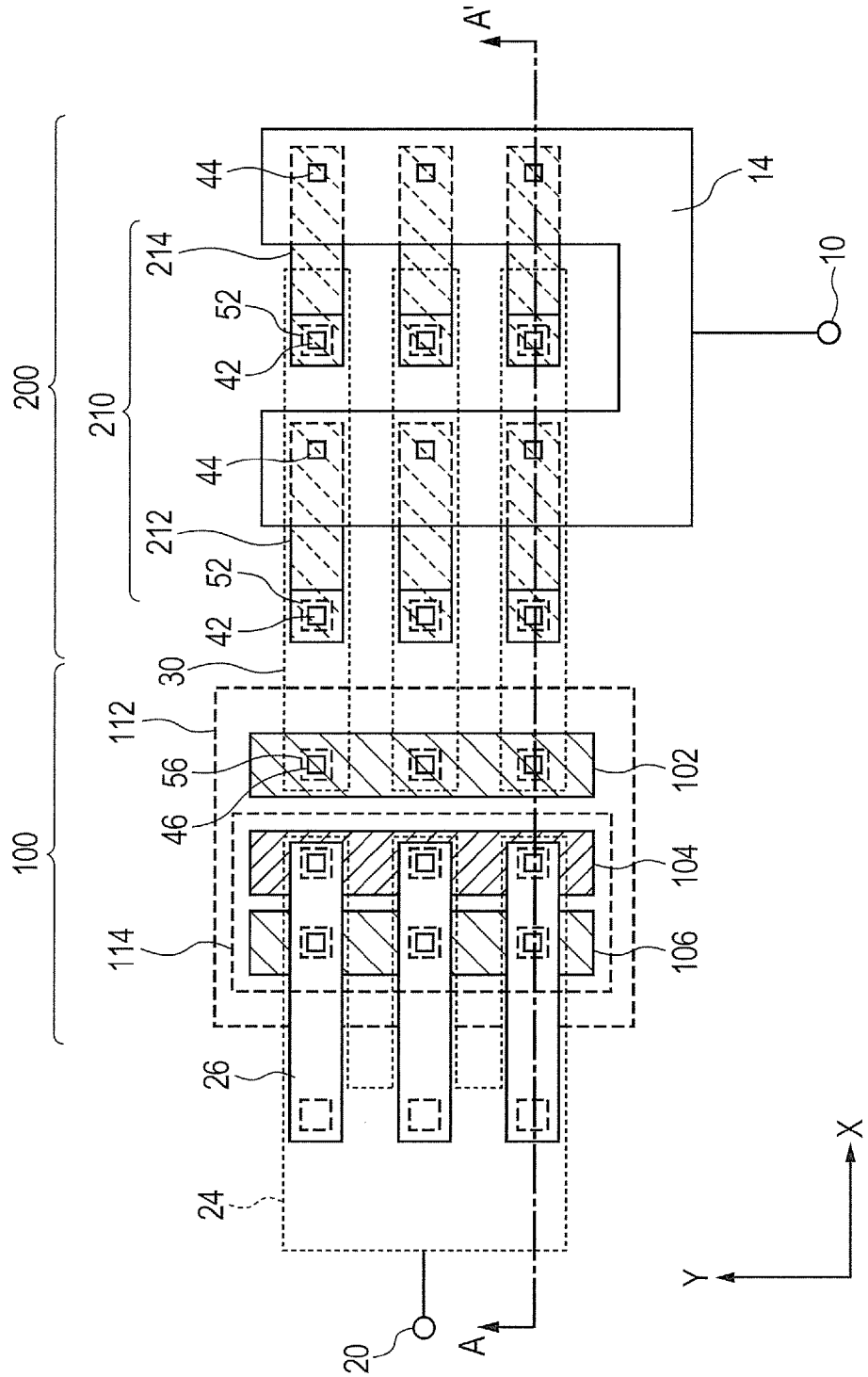
FIG. 1 is a plan view showing a configuration of a protection circuit included in a semiconductor device according to a first embodiment.

Hereinafter, embodiments of the present invention will be described with reference to the drawings. In all the drawings, the same reference numerals are given to the same components and descriptions thereof will be appropriately omitted.

First Embodiment

Figure 2:
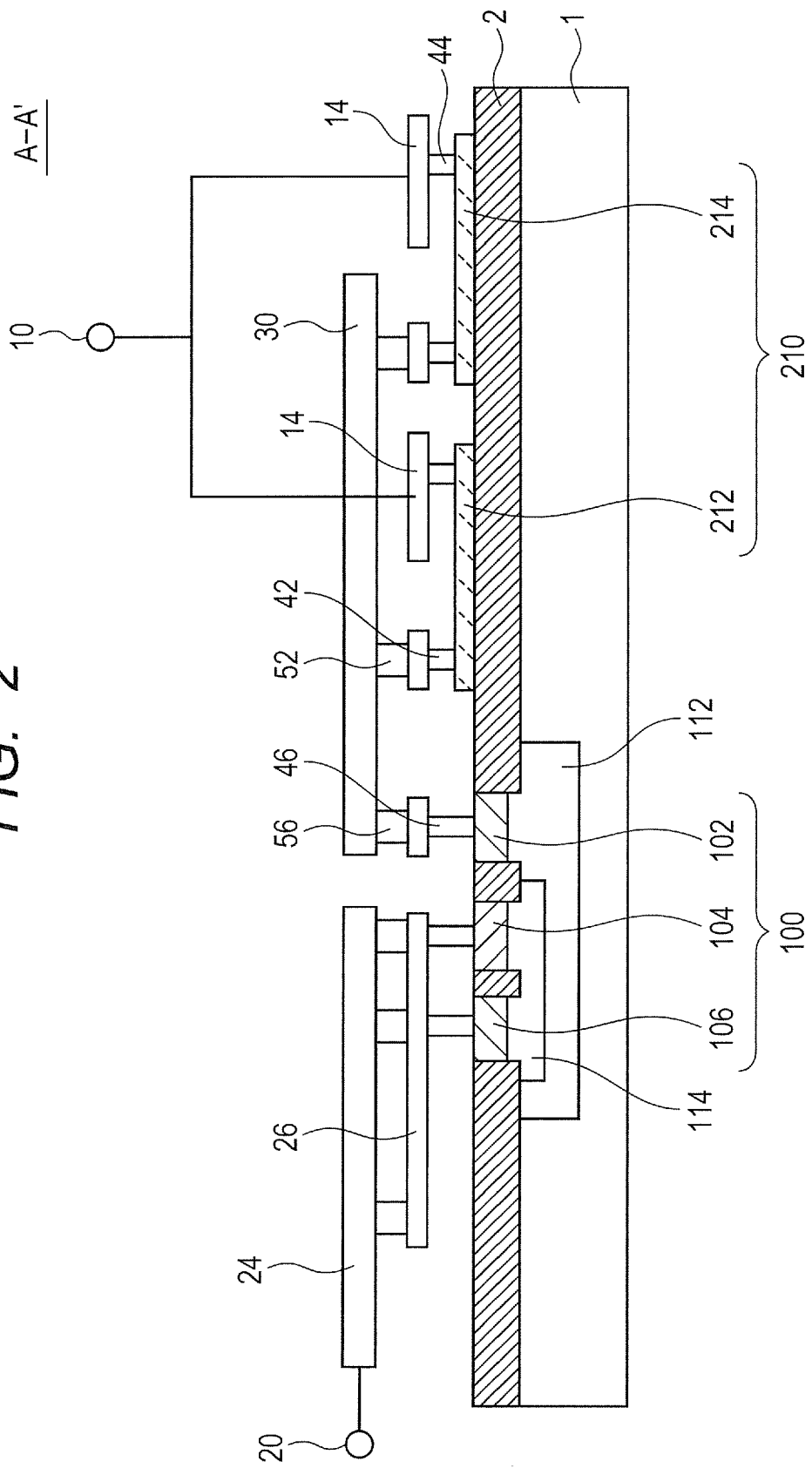
FIG. 2 is across-sectional view taken along a line A-A' in FIG. 1.
Figure 3:
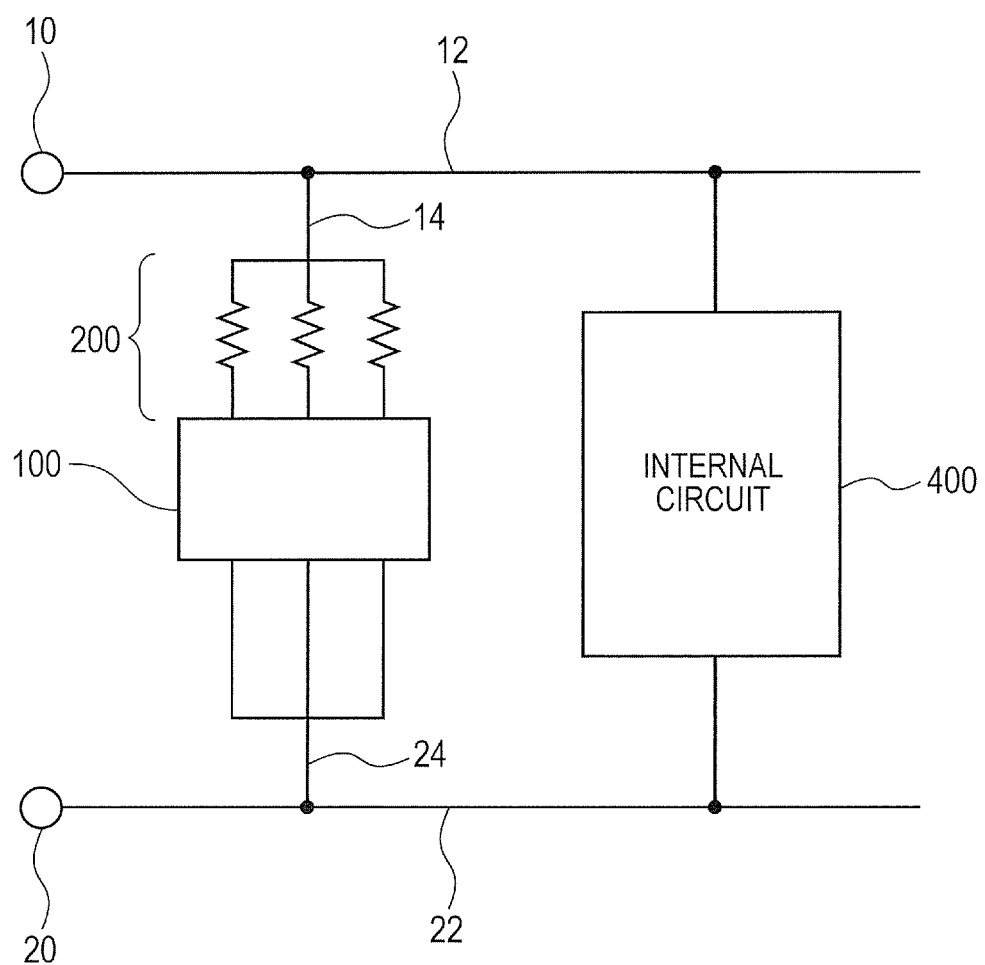
FIG. 3 is a circuit diagram of the semiconductor device shown in FIG. 1.

FIG. 1 is a plan view showing a configuration of a protection circuit included in a semiconductor device according to a first embodiment. FIG. 2 is a cross-sectional view taken along a line A-A' in FIG. 1. FIG. 3 is a circuit diagram of the semiconductor device according to the present embodiment. The semiconductor device includes a protection element 100 and a ballast resistance 200. At least one of resistances 210 included in the ballast resistance 200 has a first resistance 212 and a second resistance 214. The first resistance 212 extends in a first direction (X direction in FIG. 1) in which current flows in the protection element 100. The second resistance element 214 is coupled in parallel to the first resistance element 212 and extends in the first direction. The second resistance element 214 and the first resistance element 212 are located on the same straight line. Hereinafter, the present embodiment will be described in detail.

As shown in a circuit diagram of FIG. 3, the input side of the protection element 100 is coupled to wiring 12 through first wiring 14 and the output side is coupled to wiring 22 through second wiring 24. The wiring 12 is wiring that couples a first terminal 10 to an internal circuit 400 and the wiring 22 is wiring that couples a second terminal 20 to the internal circuit 400. That is to say, the protection element 100 is an element that protects the internal circuit 400 from over-current and over-voltage. The ballast resistance 200 is provided between the protection element 100 and the wiring 12.

As shown in FIGS. 1 and 2, the protection element 100 is a bipolar transistor, which includes a collector region 102, base region 104, and an emitter region 106. These regions are formed in a substrate 1, such as, for example, a silicon substrate. An element (for example, a MOS transistor) that forms the internal circuit 400 shown in FIG. 3 is also formed in the substrate 1. The collector region 102 is of a first conductivity type (for example, n-type) and formed in a first well 112 of the first conductivity type. The base region 104 is of a second conductivity type (for example, p-type) and formed in a second well 114 of the second conductivity type. The second well 114 is formed in the first well 112. The emitter region 106 is of the first conductivity type and formed in the second well 114. The first direction (X direction) is a direction in which the corrector region 102, the base region 104, and the emitter region 106 are arranged and in which current flows in the protection element 100 in a plan view. In a plan view, the widths (widths in the Y direction in FIG. 1) of the corrector region 102, the base region 104, and the emitter region 106 are the same.

The corrector region 102 of the protection element 100 is coupled to the first terminal 10 through the ballast resistance 200 and the emitter region 106 is coupled to the second terminal 20. The first terminal 10 is, for example, power supply pad to which a power supply potential is inputted and the second terminal 20 is, for example, a ground pad to which a ground potential is inputted. However, the first terminal 10 and the second terminal 20 are not limited to these.

The ballast resistance 200 includes a plurality of resistances 210. Each of the resistances 210 is coupled to the collector region 10 through separate wiring 30. In the present embodiment, each of the resistances 210 includes the first resistance 212 and the second resistance 214. The first resistance 212 and the second resistance 214 included in the same resistance 210 are arranged along the first direction and located on the same straight line. The first resistances 212 are arranged in parallel with each other and both ends thereof are aligned. The second resistances 214 are arranged in parallel with each other and both ends thereof are aligned.

As shown in FIG. 2, the first resistance 212 and the second resistance 214 are located over the same layer, specifically, an element separation region 2 formed of an insulating layer, and formed of a polysilicon film. As shown in FIGS. 1 and 2, the first resistances 212 have the same planar shape and the same thickness and the second resistances 214 have the same planar shape and the same thickness. In the present embodiment, the first resistances 212 and the second resistances 214 have the same planar shape and the same thickness. In the present embodiment, the planer shape of the first resistances 212 and the second resistances 214 is a rectangle.

As shown in FIG. 1, when seen in the Y direction in FIG. 1 (a direction perpendicular to the first direction), the first resistances 212 and the second resistances 214 are located inside the collector region 102 (a portion in which current flows in the protection element 100). The first resistance 212 and the second resistance 214 included in the same resistance 210 are coupled to the collector region 102 through the same wiring 30. The wirings 30, each of which is coupled to a separate resistance 210, extend in parallel with each other along the first direction. In a plan view, the Wiring 30, the first resistance element 212, and the second resistance element 214 extend on the same straight line.

The first resistance 212 and the second resistance 214 are coupled to the first terminal 10 through the first wiring 14. In the present embodiment, in a plan view, the first wiring 14 branches into two before being coupled to the first resistances 212 and the second resistances 214 through contacts 44. One wiring after the branch extends over the first resistances 212 in a direction perpendicular to the first resistances 212 (the Y direction in FIG. 1) and the other wiring after the branch extends over the second resistances 214 in a direction perpendicular to the second resistances 214

As shown in FIG. 2, the first wiring 14 is located in a wiring layer one layer higher than the first resistances 212 and the second resistances 214 and the second wiring 24 and the wiring 30 are located in a wiring layer one layer higher than the first wiring 14. The first wiring 14 is coupled to one end of each first resistance 212 and each second resistance 214 through the contacts 44. The wiring 30 is coupled to the other end of each first resistance 212 and each second resistance 214 through a via 52, an island-shaped conductor pattern formed in the same layer as that of the first wiring 14, and a contact 42. In the present embodiment, end portions of the first resistances 212 and the second resistances 214, which are coupled to the first wiring 14 are located on the same side of all the first resistances 212 and the second resistances 214 (right side in FIGS. 1 and 2). End portions of the first resistances 212 and the second resistances 214, which are coupled to the wiring 30 are located on the same side of all the first resistances 212 and the second resistances 214 (left side in FIGS. 1 and 2).

The wiring 30 is coupled to the collector region 102 through a via 56, an island-shaped conductor pattern formed in the same layer as that of the first wiring 14, and a contact 46. The second wiring 24 is coupled to the base region 104 and the emitter region 106 through vias, wiring 26 in the same layer as that of the first wiring layer 14, and contacts.

As shown in FIG. 1, a plurality of wirings 26 are provided. For example, the number of the wirings 26 is the same as that of the wirings 30. In the example shown in FIG. 1, the wiring 26 and the wiring 30 extend on the same straight line in a plan view. The layout of the wirings 26 is not limited to this example. The width of the second wring line 24 (width in the Y direction in FIG. 1) is large and the second wring line 24 overlaps all the wirings 26 in a plan view. However, the second wring line 24 has a comb-teeth shape in a portion which overlaps the wirings 26.

Next, the functions and the effects of the present embodiment will be described. One of the factors that determine the allowable current amount of the protection element 100 is a width of a portion in which current flows in the protection element 110 (in the example in FIG. 1, the widths of the collector region 102, the base region 104, and the emitter region 106). Thus, it is preferable to increase the width of a portion in which current flows in the protection element 100 in order to increase the allowable current amount of the protection element 100. On the other hand, semiconductor devices are required to be small. Therefore, the width of a portion in which current flows in the protection element 100 is determined by ESD tolerance necessary for the semiconductor device, Therefore, it is preferable to reduce the width of the ballast resistance 200 in a direction (Y direction in FIG. 1) perpendicular to the direction in which current flows in the protection element 100 in order not to increase the size of the protection circuit including the protection element 100 and the ballast resistance 200.

On the other hand, it is preferable to increase the number of resistances included in the ballast resistance 200 in order to increase the allowable current amount of the ballast resistance 200.

In the present embodiment, at least one of the resistances 210 includes the first resistance 212 and the second resistance 214. The first resistance 212 and the second resistance 214 are coupled in parallel to each other. Therefore, the allowable current amount of the ballast resistance 200 can be increased.

The first resistance 212 and the second resistance 214 extend in the first direction (X direction in FIG. 1) in which current flows in the protection element 100. The second resistance 214 and the first resistance 212 are located on the same straight line, so that the width of the ballast resistance 200 does not exceeds the width of the ballast resistance 200 in a direction (Y direction in FIG. 1) perpendicular to the direction in which current flows in the protection element 100.

Therefore, according to the present embodiment, it is possible to satisfy two conflicting requests at the same time.

In particular, in the present embodiment, all the resistances 210 include the first resistance 212 and the second resistance 214. Therefore, it is possible to sufficiently prevent the width of the protection circuit from increasing. Therefore, the width of the ballast resistance 200 in the Y direction in FIG. 1 can be smaller than that of the protection element 100.

In the present embodiment, the planar shapes of the first resistances 212 are the same and the planar shapes of the second resistances 214 are the same. Therefore, it is possible to prevent the resistance values of the resistances 210 from varying.

In present embodiment, the planer shapes of the first resistance 212 and the second resistance 214 are the same. Therefore, it is possible to prevent current from concentrating in one of the first resistance 212 and the second resistance 214.

In the present embodiment, the first resistances 212 and the second resistances 214 are formed in the same layer. Therefore, it is possible to prevent the thicknesses of the first resistances 212 and the second resistances 214 from varying. Therefore, it is possible to prevent the resistance values of the first resistances 212 and the second resistances 214 from varying.

In the present embodiment, regarding a current path from the first terminal 10 to the ballast resistance 200, there is a single current path from the first terminal 10 to the first wiring 14. The current path branches into two wirings to the first resistances 212 and the second resistances 214. Thereby, as compared with a case in which the wiring path branches into two before the first wiring 14, it is possible to prevent a difference between a wiring resistance from the first terminal 10 to the first resistances 212 and a wiring resistance from the first terminal 10 to the second resistances 214 from occurring.

Second Embodiment

Figure 4:
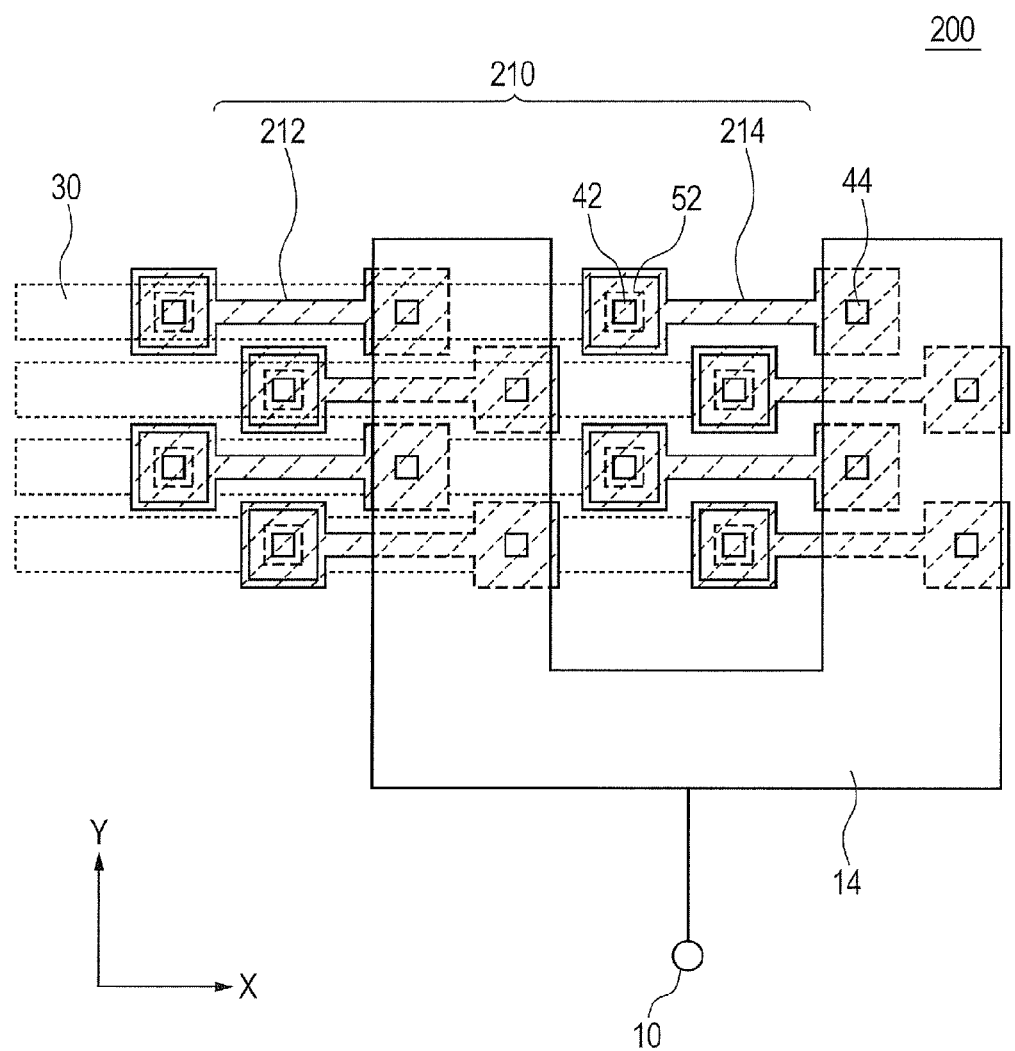
FIG. 4 is a plan view showing a configuration of a ballast resistance included in a semiconductor device according to a second embodiment.

FIG. 4 is a plan view showing a configuration of a ballast resistance 200 included in a semiconductor device according to a second embodiment. The ballast resistance 200 according, to the present embodiment is the same as the ballast resistance 200 according to the first embodiment except for the planar shapes of the first resistances 212 and the second resistances 214 and the layout thereof.

In the present embodiment, in a first resistance 212, portion with which a contact 42 is in contact and a portion with which a contact 44 is in contact, that is, both ends, are thicker than the other portion. A plurality of the second resistances 212 are arranged so that the end portions form a zigzag pattern. Specifically, in the X direction in FIG. 4, one end of the first resistance 212 is located at a portion other than the end portions (that is, a thin portion) of an adjacent first resistance 212 of the first resistance 212. In the Y direction in FIG. 4, end portions of the first resistances 212 adjacent to each other partially overlap each other.

The second resistances 214 have the same layout as that of the first resistances 212.

Also by the present embodiment, it is possible to obtain the same effect as that of the first embodiment. In the Y direction in FIG. 4, the first resistances 212 adjacent to each other are arranged so that the end portions thereof partially overlap each other and the second resistances 214 adjacent to each other are arranged so that the end portions thereof partially overlap each other. Thereby, it is possible to reduce the width in the Y direction in FIG. 4, which is required to arrange the first resistances 212 and the second resistances 214. Therefore, the area of the ballast resistance 200 can be reduced.

Third Embodiment

Figure 5:
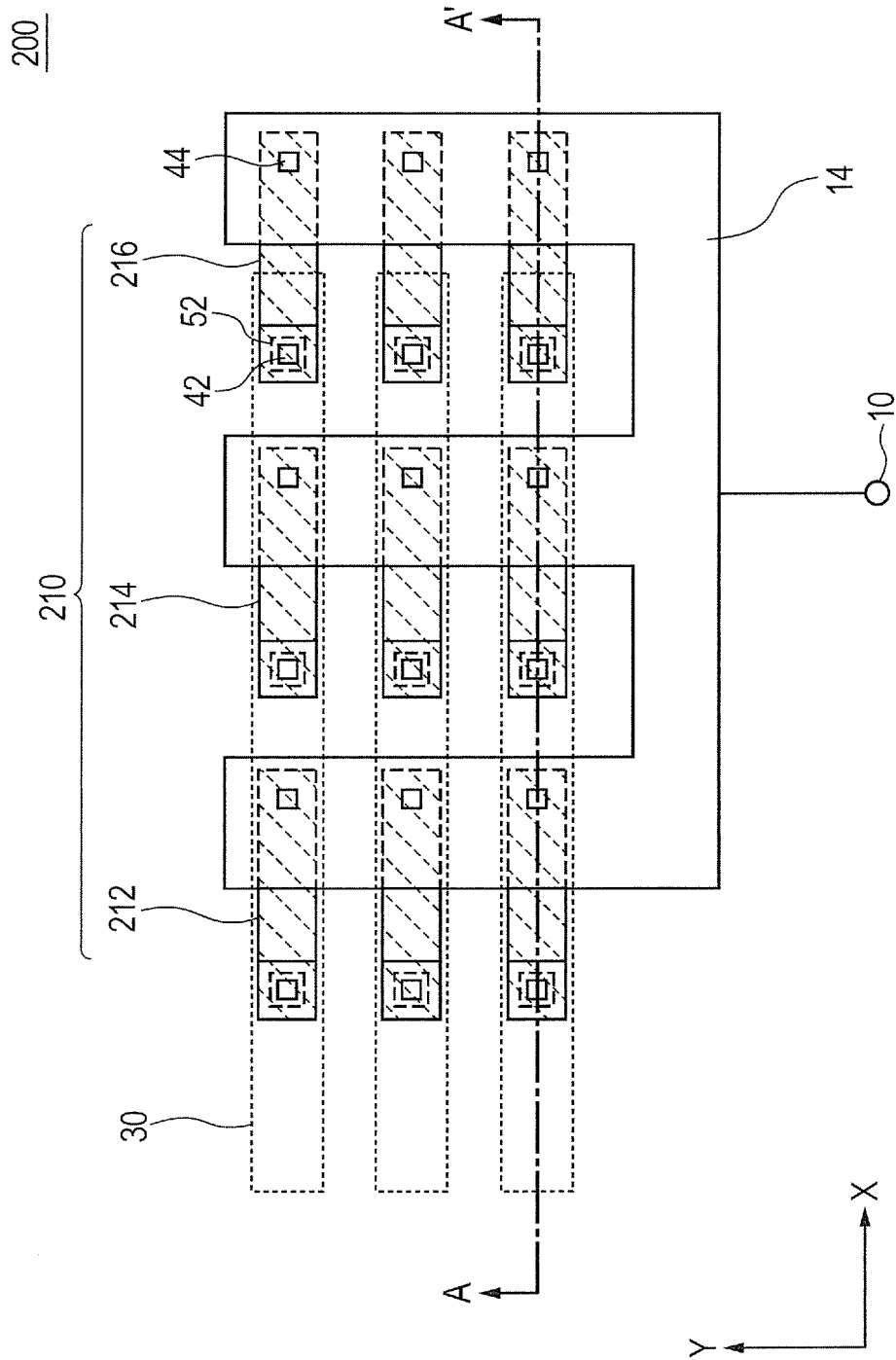
FIG. 5 is a plan view showing a configuration of a ballast resistance included in a semiconductor device according to a third embodiment.
Figure 6:
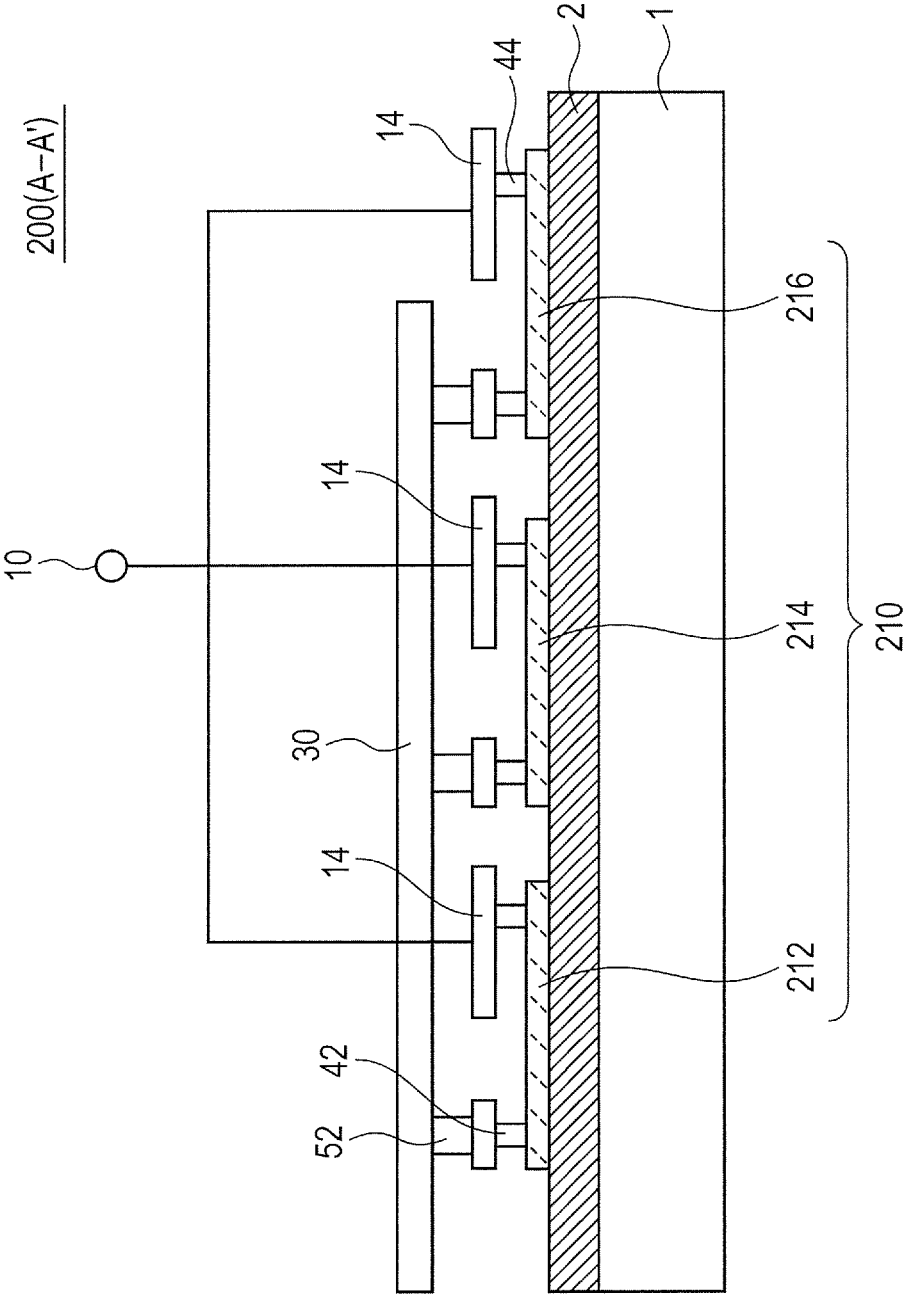
FIG. 6 is a cross-sectional view taken along a line A-A' in FIG. 5.

FIG. 5 is a plan view showing a configuration of a ballast resistance 200 included in a semiconductor device according to a third embodiment. FIG. 6 is a cross-sectional view taken along a line A-A' in FIG. 5. The ballast resistance 200 according to the present embodiment is the same as the ballast resistance 200 according to the first embodiment or the second embodiment except that the resistance 210 includes third resistances 216. FIG. 5 shows a case similar to the case of the first embodiment.

The third resistance 216 is coupled in parallel to the first, resistance 212 and the second resistance 214. The third resistance 216 is formed in the same layer as that of the first resistance 212 and the second resistance 214 and coupled in parallel to the first resistance 212 and the second resistance 214. The planar shape and the thickness of the third resistance 216 are the same as those of the first resistance 212 and the second resistance 214. In the present embodiment, one resistance, 210 is formed by coupling the first resistance 212, the second resistance 214, and the third resistance 216 in parallel with each other. Although the resistance value of the resistance 210 decreases by providing the third resistance 216, the decrease of the resistance value of the resistance 210 can be compensated by increasing the lengths of the first resistance 212, the second resistance 214, and the third resistance 216 as needed.

The number of resistances included in one resistance 210 may be further increased as needed.

Also by the present embodiment, it is possible to obtain the same effect as that of the first embodiment or the second embodiment. The number of resistances included in the resistance 210 is increased, so that the allowable current amount of the ballast resistance 200 can be increased.

Fourth Embodiment

Figure 7:
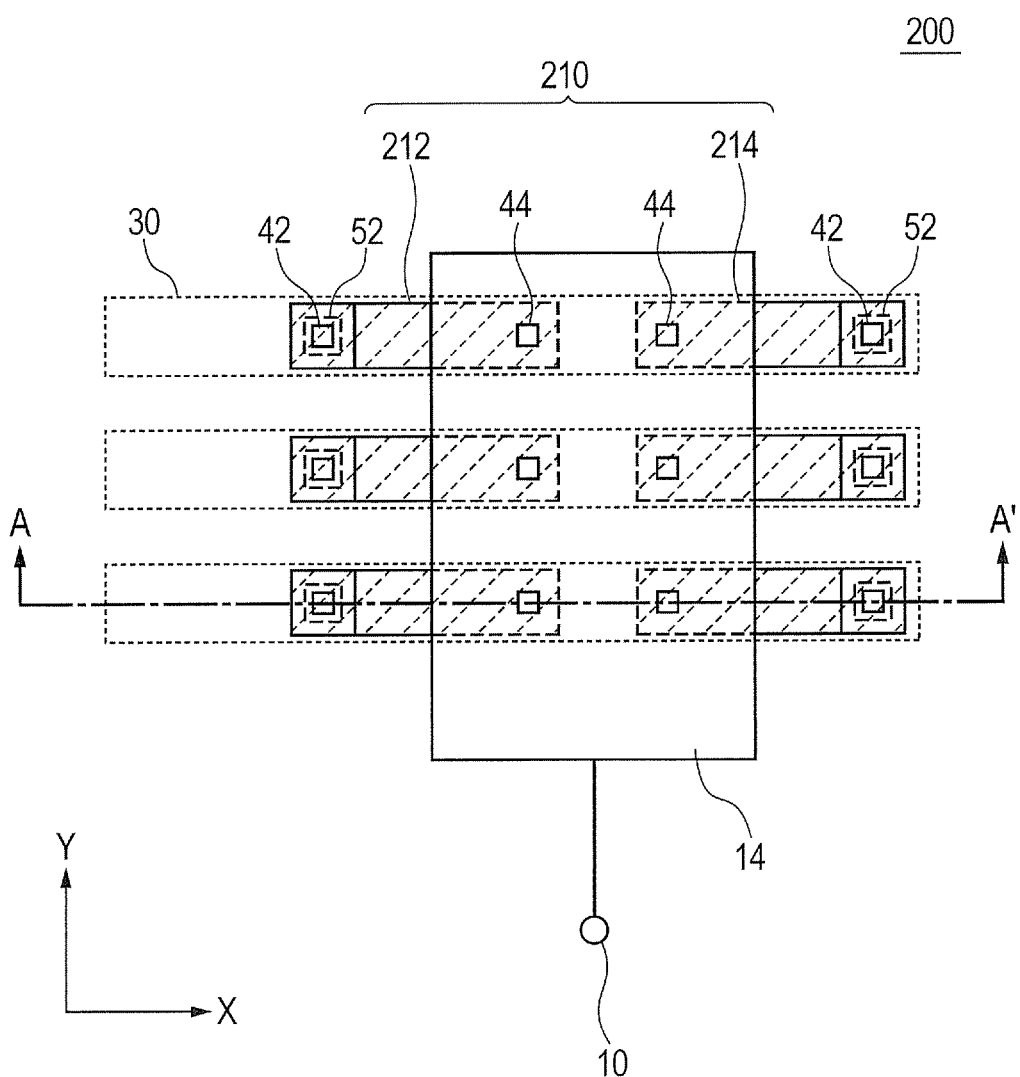
FIG. 7 is a plan view showing a configuration of a ballast resistance included in a semiconductor device according to a fourth embodiment.
Figure 8:
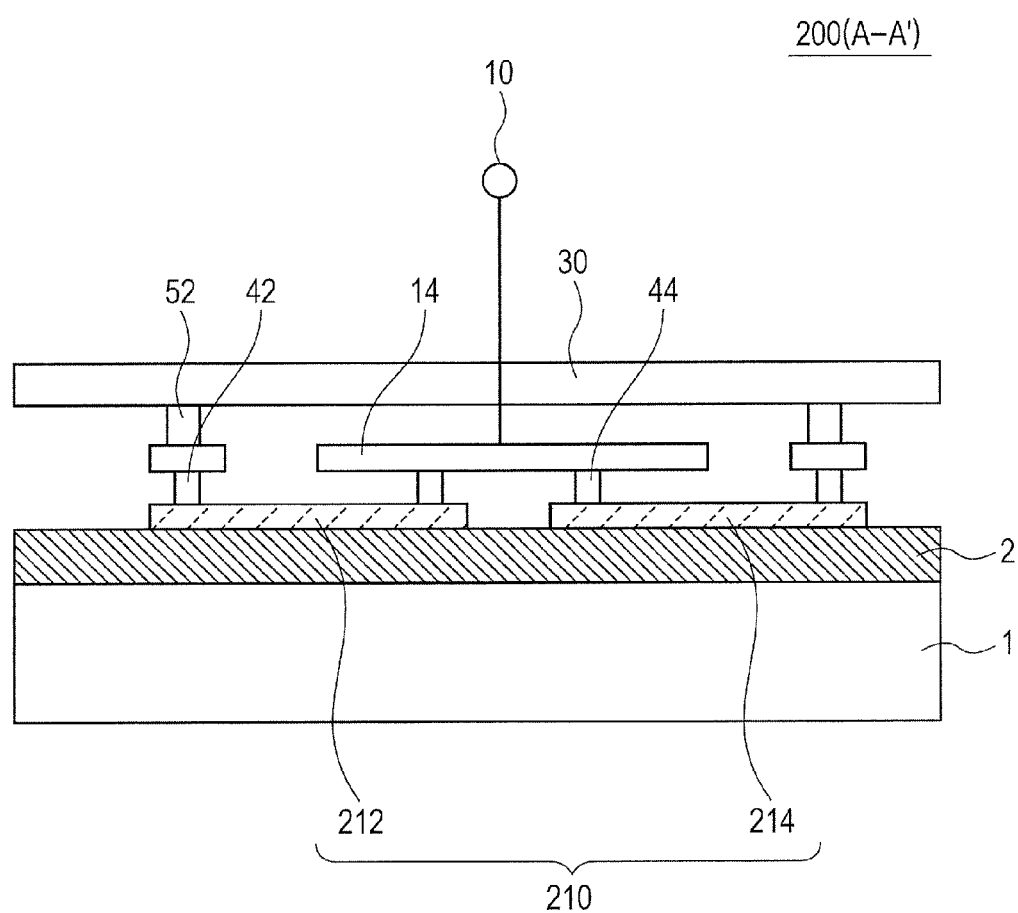
FIG. 8 is a cross-sectional view taken along a line A-A' in FIG. 7.

FIG. 7 is a plan view showing a configuration of a ballast resistance 200 included in a semiconductor device according to a fourth embodiment. FIG. 8 is a cross-sectional view taken along a line A-A' in FIG. 7. The ballast resistance 200 according to the present embodiment is the same as the ballast resistance 200 according to one of the first to the third embodiments except for the coupling structure of the first and the second resistances 212 and 214 and the first wiring 14 and the coupling structure of the first and the second resistances 212 and 214 and the wiring 30. FIGS. 7 and 8 show a case similar to the case of the first embodiment.

In the present embodiment, the end portions of the first resistance 212 and the second resistance 214, which are coupled to the first wiring 14, face each other. The end Portions of the first resistance 212 and the second resistance 214, which are coupled to the wiring 30, face opposite each other.

No contact is located between the contact 44 at which the first wiring 14 is coupled to the first resistance 212 and the contact 44 at which the first wiring 14 is coupled to the second resistance 214. Therefore, the first wiring 14 need not branch into two and there is one first wiring 14 at the portion where the first wiring 14 is coupled to the contact 44. It is possible to increase the width of the first wiring 14. In the example shown in FIGS. 7 and 8, only one contact 44 is illustrated in one first resistance 212 or one second, resistance 214. However, a plurality of contacts 44 may be provided in one first resistance 212 and one second resistance 214.

Also by the present embodiment, it is possible to obtain the same effect as that of the first embodiment. Since the width of the first wiring 14 can be increased, the wiring resistance of the first wiring 14 can be reduced. Thereby, it is possible to prevent the amount of current from being uneven among a plurality of resistances 210.

Fifth Embodiment

Figure 9:
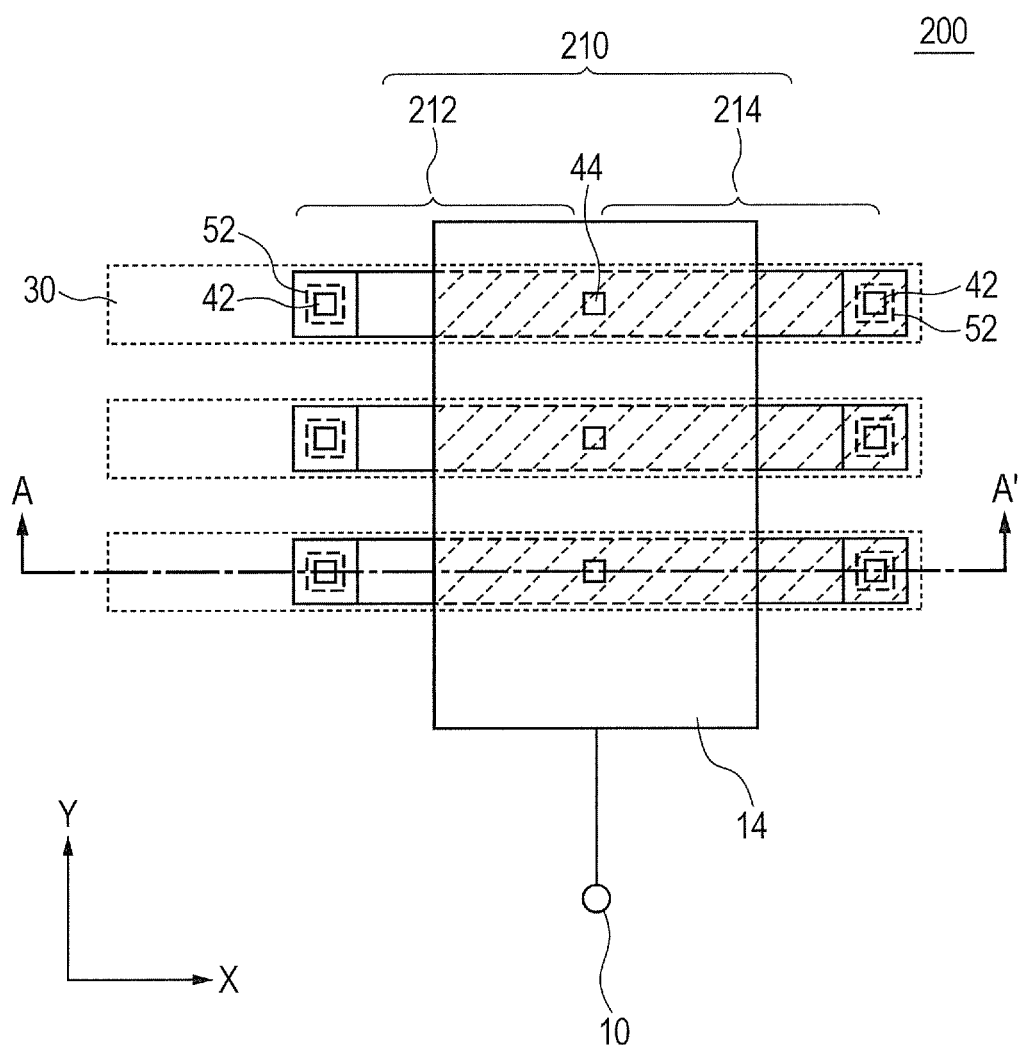
FIG. 9 is a plan view showing a configuration of a ballast resistance included in a semiconductor device according to a fifth embodiment.
Figure 10:
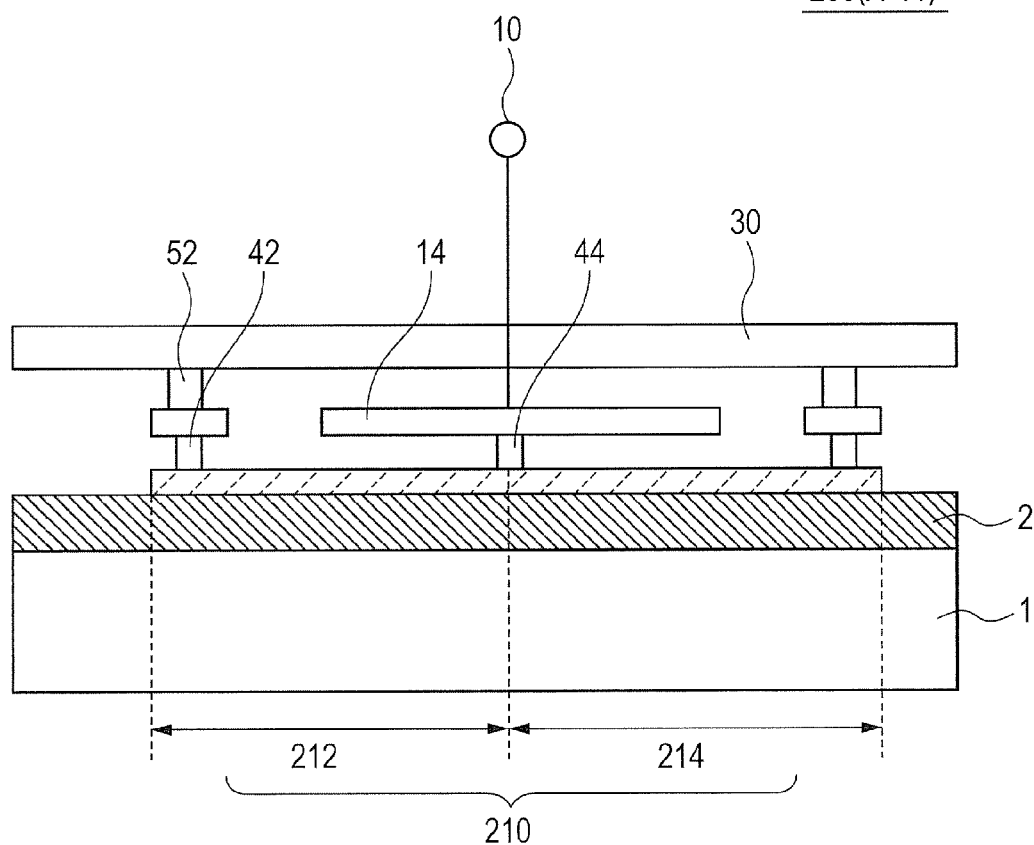
FIG. 10 is a cross-sectional view taken along a line A-A' in FIG. 9.

FIG. 9 is a plan view showing a configuration of a ballast resistance 200 included in a semiconductor device according to a fifth embodiment. FIG. 10 is a cross-sectional view taken along a line A-A' in FIG. 9. The ballast resistance 200 according to the present embodiment is the same as the ballast resistance 200 according to the fourth embodiment except for the points described below.

In the present embodiment, the resistance 210 is formed by one resistive element. The contact 44 (an input contact) which couples the first wiring 14 and the resistance 210 together is coupled to the center of the resistance 210 as seen in the first direction (X direction in FIG. 9). The contacts 42 (a first output contact and a second output contact), which couple the resistance 210 and the wiring 30 together, are coupled to both ends of the resistance 210, respectively. In the resistance 210, a portion located between the contact 44 and one contact 42 is the first resistance 212 and a portion located between the contact 44 and the other contact 42 is the second resistance 214. In other words, the resistance 210 according to the present embodiment can be considered to have a structure in which, in the resistance 210 described in the fourth embodiment, the first resistance 212 and the second resistance 214 are coupled to each other at the end portions around the contacts 44.

Also by the present embodiment, it is possible to obtain the same effect as that of the fourth embodiment. The first resistance 212 and the second resistance 214 are formed by one resistive element, so that the length of the resistance 210 (in the X direction in FIG. 9) can be shorter than that in the structure described in the fourth embodiment. Thereby, the area of the protection circuit can be reduced.

Sixth Embodiment

Figure 11:
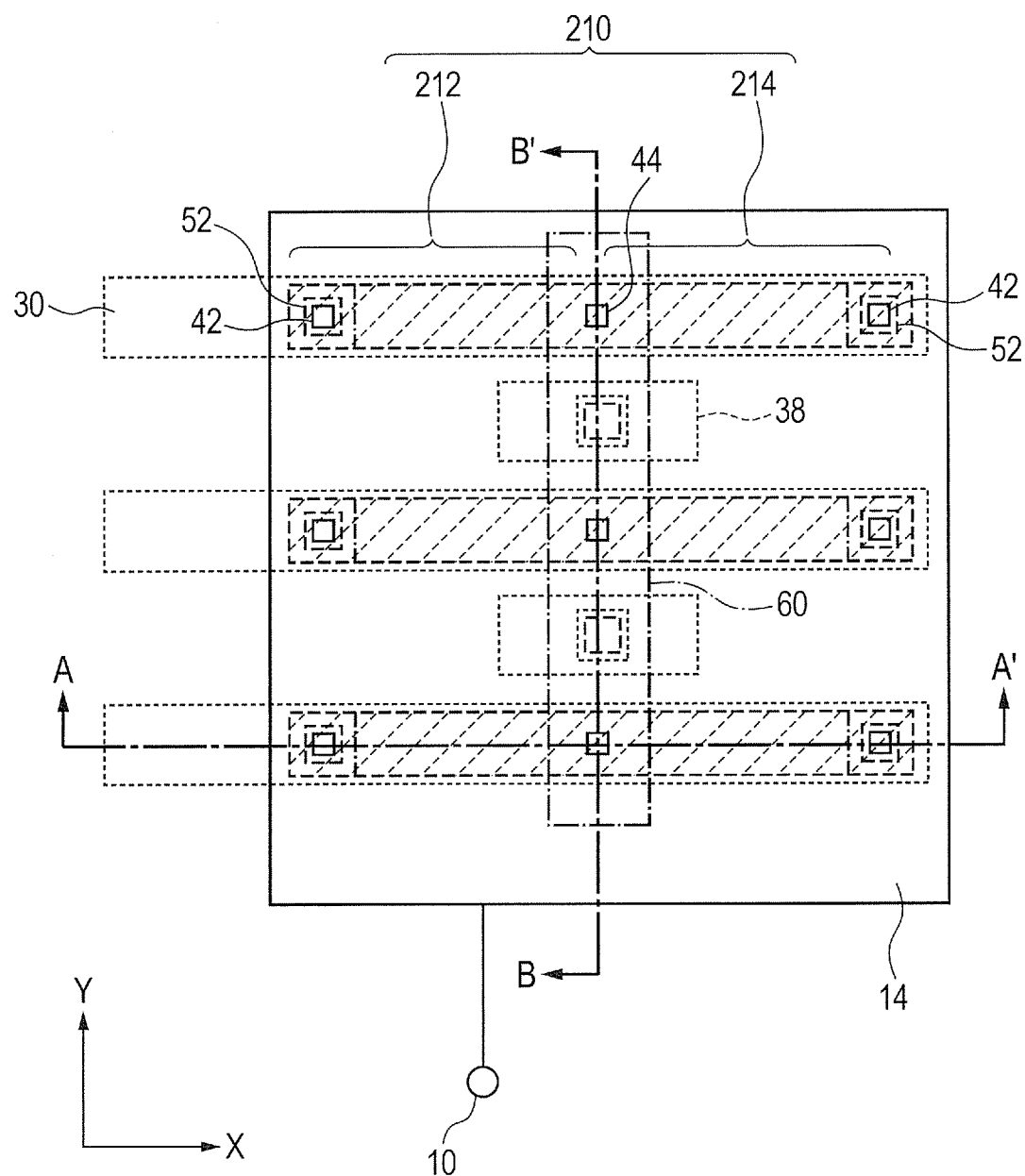
FIG. 11 is a plan view showing a configuration of a ballast resistance included in a semiconductor device according to a sixth embodiment.
Figure 12:
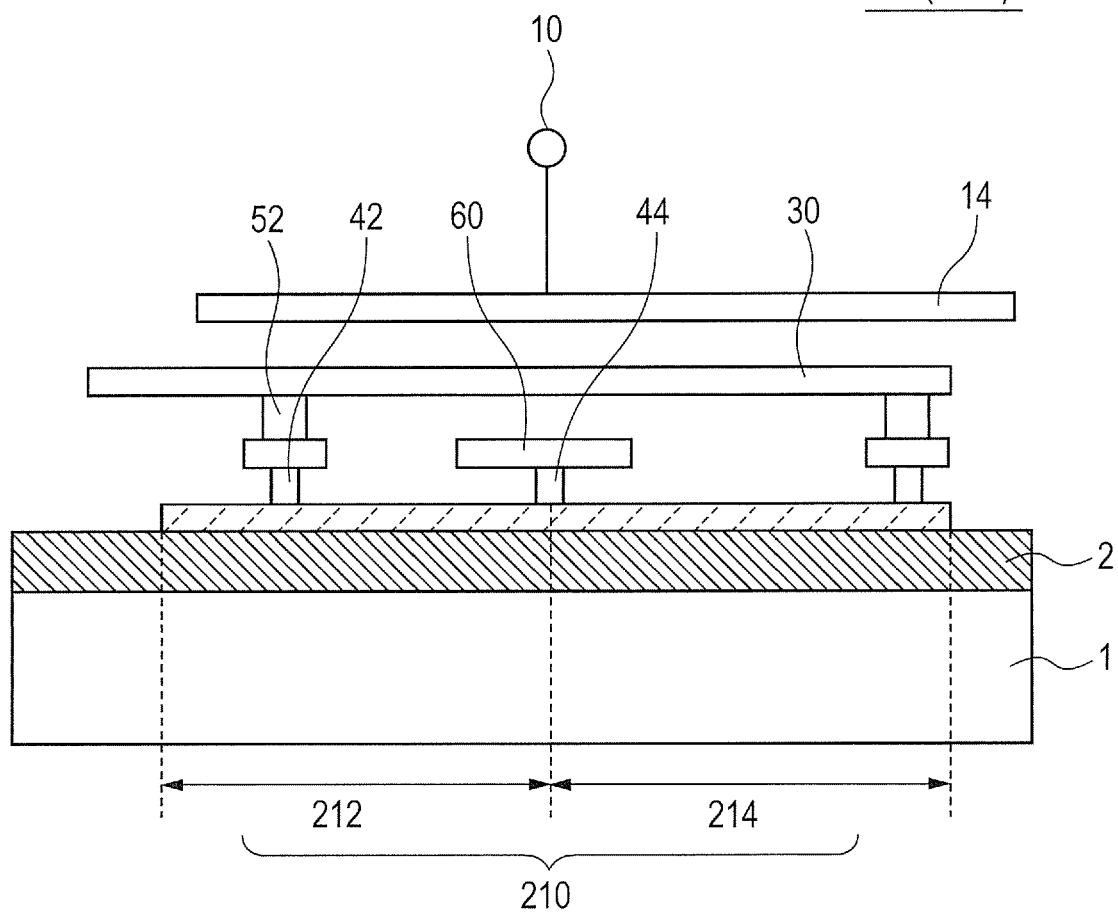
FIG. 12 is a cross-sectional view taken along a line A-A' in FIG. 11.
Figure 13:
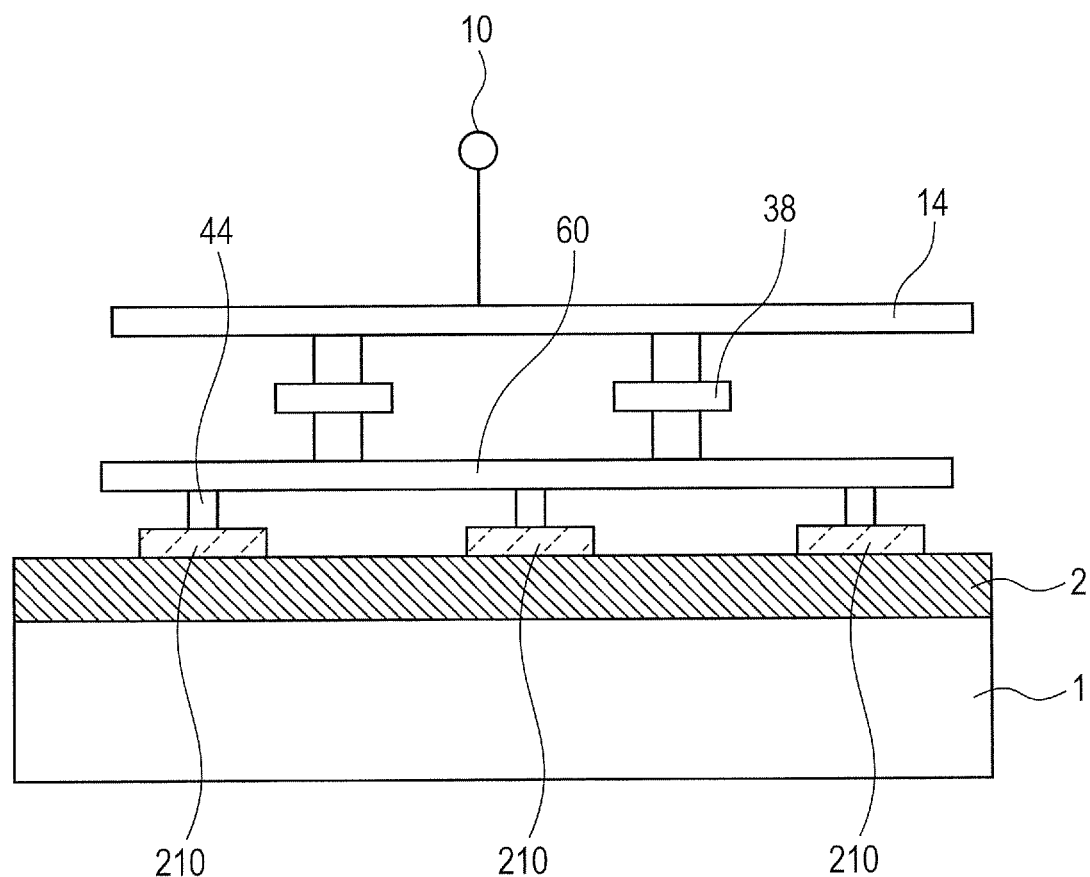
FIG. 13 is a cross-sectional view taken along a line B-B' in FIG. 11.

FIG. 11 is a plan view showing a configuration of a ballast resistance 200 included in a Semiconductor device according to a sixth embodiment. FIG. 12 is a cross-sectional view taken along a line A-A' in FIG. 11. FIG. 13 is a cross-sectional view taken along a line B-B' in FIG. 11. The semiconductor device according to the present embodiment is the same as the semiconductor device according to the fifth embodiment except for a wiring structure which couples the first wiring 14 to the ballast resistance 200.

In the present embodiment, the first wiring 14 is located in a wiring layer higher than that of the wiring 30 (for example, in a wiring layer three layers higher than the resistance 210). As shown in FIGS. 11 and 13, the first wiring 14 is coupled to a plurality of resistances 210 through an island-Shaped conductor pattern 38 located in the same layer as that of the wiring 30, vias located above and below the conductor pattern 38, the wiring 60 located in a wiring layer between the wiring 30 and the resistance 210, and a plurality of contacts 44. Specifically, the vias and the conductor pattern 38, which couple the first wiring 14 and the wiring 60 together, are provided in a portion that does not overlap the resistance 210 and the wiring 30 in a plan view. In the present embodiment, the vias and the conductor pattern 38, which couple the first wiring 14 and the wiring 60 together, are provided in each portion located between a plurality of resistances 210. The wiring 60 extends in a direction perpendicular to the wiring 30 (the Y direction in FIG. 11) and are coupled to the resistances 210 through separate contacts 44.

Also by the present embodiment, it is possible to obtain the same effect as that of the fifth embodiment. The first wiring 14 is formed in a wiring layer higher than that of the wiring 30, so that the width of the first wiring 14 can be sufficiently large. Therefore, it is possible to further reduce the wiring resistance of the first wiring 14. Thereby, it is possible to further prevent the amount of current from being uneven among a plurality of resistances 210.

Seventh Embodiment

Figure 14:
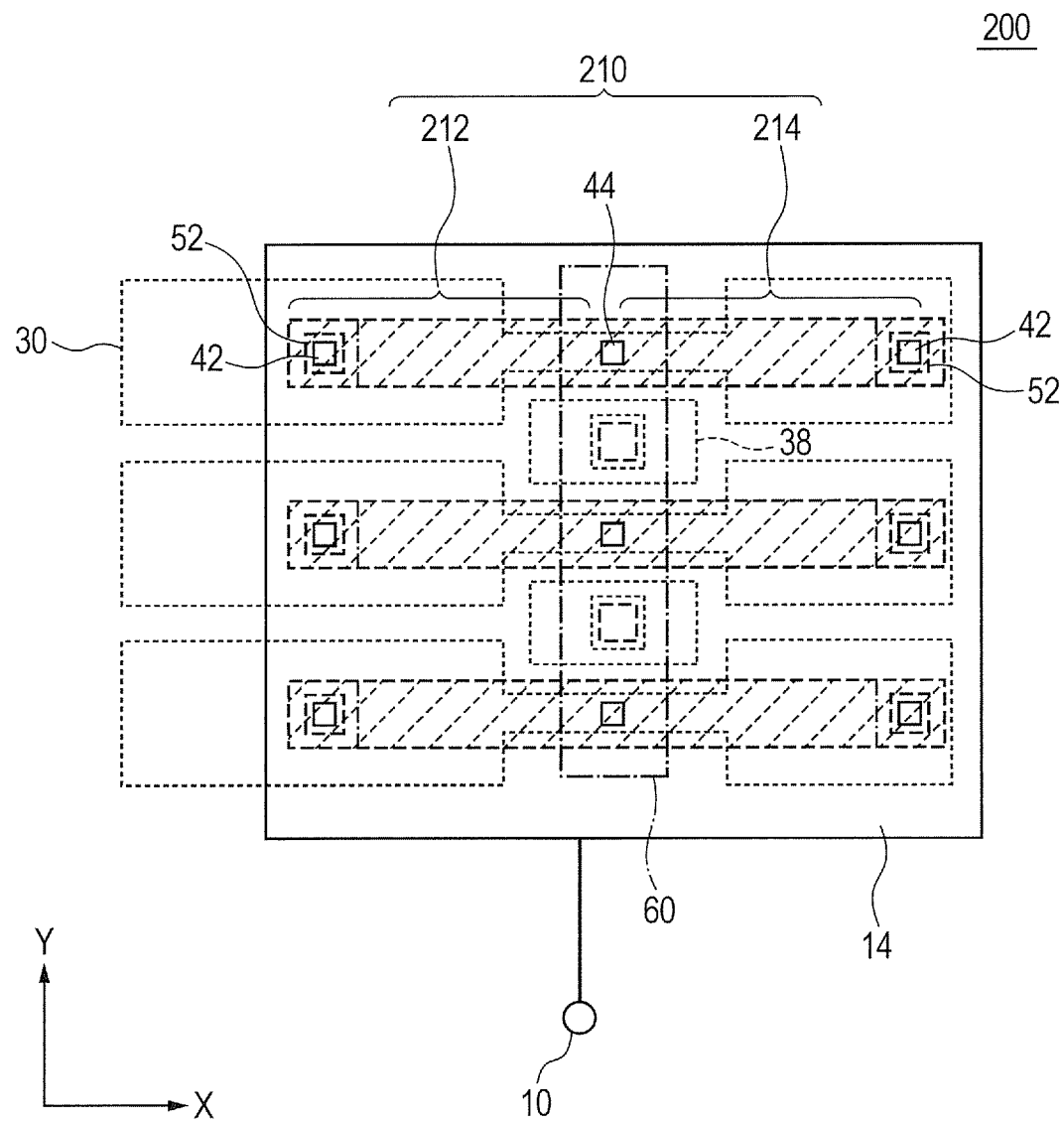
FIG. 14 is a plan view showing a configuration of a ballast resistance included in a semiconductor device according to a seventh embodiment.

FIG. 14 is a plan view showing a configuration of a ballast resistance 200 included in a semiconductor device according to a seventh embodiment. The semiconductor device according to the present embodiment is the same as the Semiconductor device according to the sixth embodiment except for the planar shape of the wiring 30.

In the wiring 30 according to the present embodiment, the width of a portion facing the conductor pattern 38 in a direction (Y direction in FIG. 14) perpendicular to the direction in which the wiring 30 extends is narrower than that of the other portion. As seen in a direction (Y direction in FIG. 14) perpendicular to the direction in which the wiring 30 extends, a portion of the wiring 30, which is not narrowed, partially overlaps the conductor pattern 38.

Also by the present embodiment, it is possible to obtain the same effect as that of the first embodiment. Further, the width of a portion facing the conductor pattern 38 in the Y direction in FIG. 14 is set to be narrower than that of the other portion and the other portion of the wiring 30 is not narrowed, so that it is possible to prevent the resistance of the wiring 30 from being too large.

Eighth Embodiment

Figure 15:
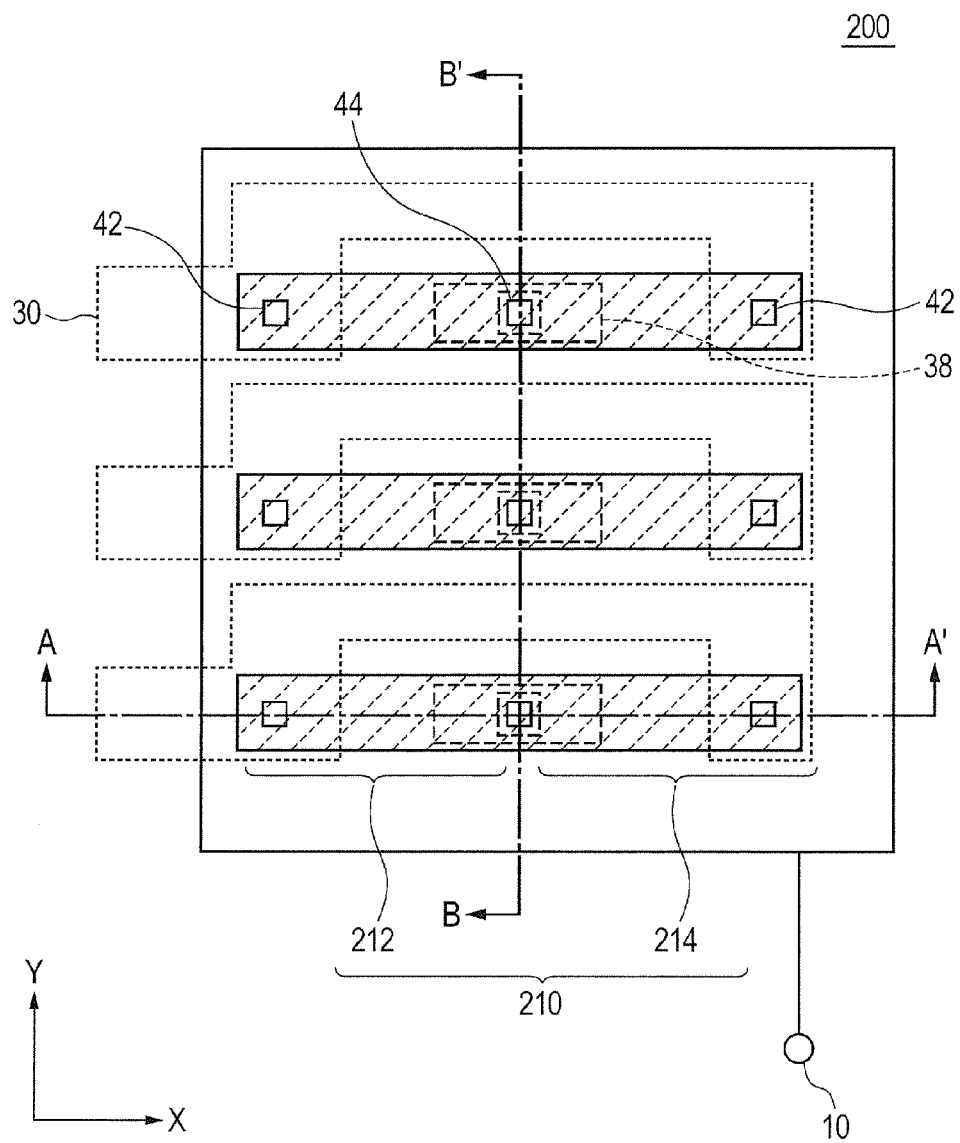
FIG. 15 is a plan view showing a configuration of a ballast resistance included in a semiconductor device according to an eighth embodiment.
Figure 16:
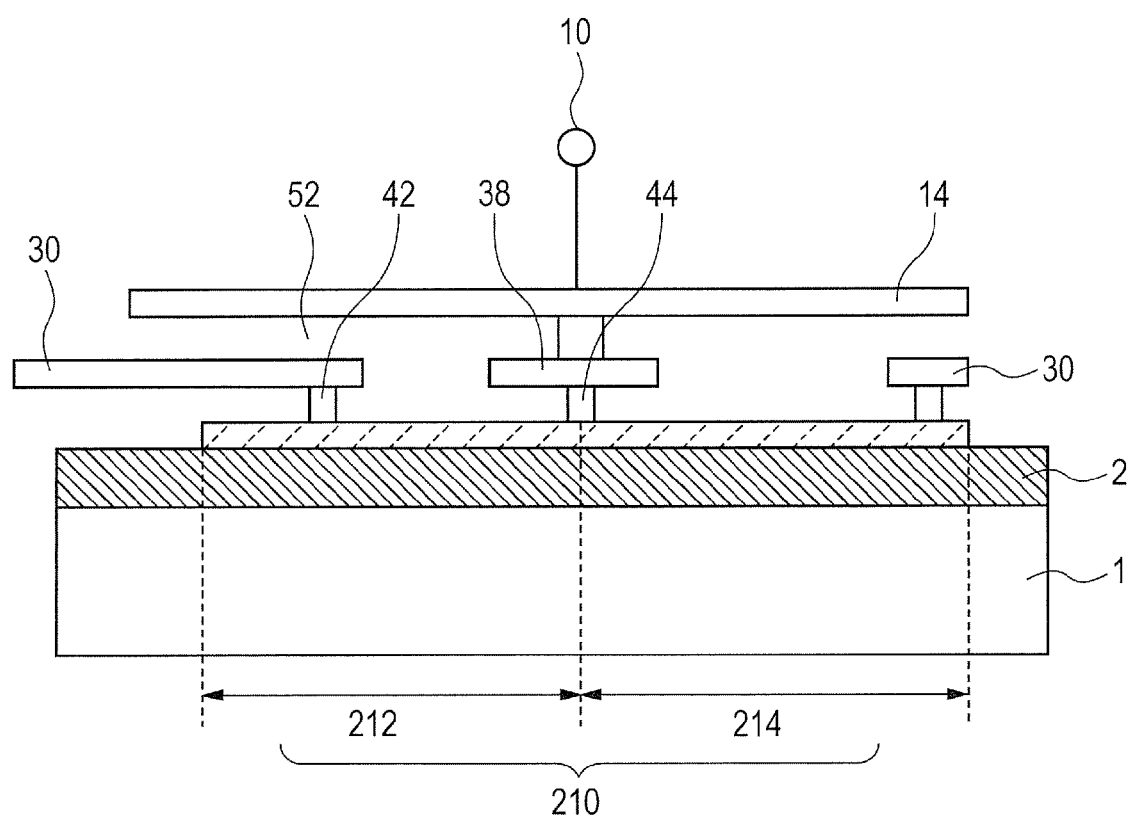
FIG. 16 is a cross-sectional view taken along a line-A-A' in FIG. 15.
Figure 17:
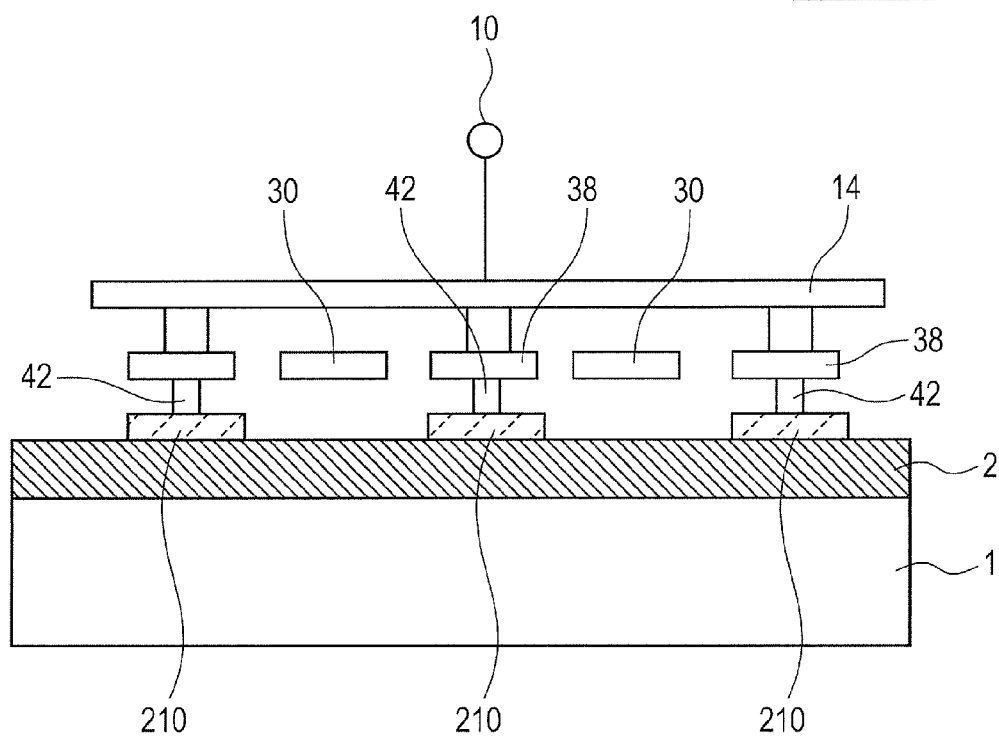
FIG. 17 is a cross-sectional view taken along a line B-B' in FIG. 15.

FIG. 15 is a plan view showing a configuration of a ballast resistance 200 included in a semiconductor device according to an eighth embodiment. FIG. 16 is a cross-sectional view taken along a line A-A' in FIG. 15. FIG. 17 is a cross-sectional view taken along a line B-B' in FIG. 15. The Semiconductor device according to the present embodiment is the same as the semiconductor device according to the sixth embodiment except for a wiring structure which couples the first wiring 14 to the ballast resistance 200.

In the present embodiment, the wiring 30 and the conductor pattern 38 are formed in a wiring layer one layer higher than that of the resistance 210. The first wiring 14 is formed in a wiring layer one layer higher than that of the wiring layer 30. The first wiring 14 is coupled to the resistance 210 through a via, the conductor pattern 38, and the contact 44. In other words, in the present embodiment, there is no wiring 60 described in the sixth embodiment. In a plan view, the via, the conductor pattern 38, and the contact 44, which are coupled to the first wiring 14, overlap the resistance 210. A portion of the wiring 30, which is located between two contacts 44, extends on a straight line different from the resistance 210 in order not to interfere with the conductor pattern 38. However, a portion of the wiring 30 (a left end portion in FIG. 15), which is located between the protection element 100 (see FIG. 1) and the resistance 210 in a plan view, extends on the same straight line as that on which the resistance 210 extends.

According to the present embodiment, the first wiring 14 is formed in a wiring layer higher than that of the wiring 30, so that the width of the first wiring 14 can be sufficiently large. Therefore, it is possible to further reduce the wiring resistance of the first wiring 14. Thereby, it is possible to further prevent the amount of current from being uneven among a plurality of resistances 210. Further, it is possible to couple the first wiring 14 and the resistance 210 together by wiring layers, the number of which is smaller than that in the sixth embodiment by one.

Ninth Embodiment

Figure 18:
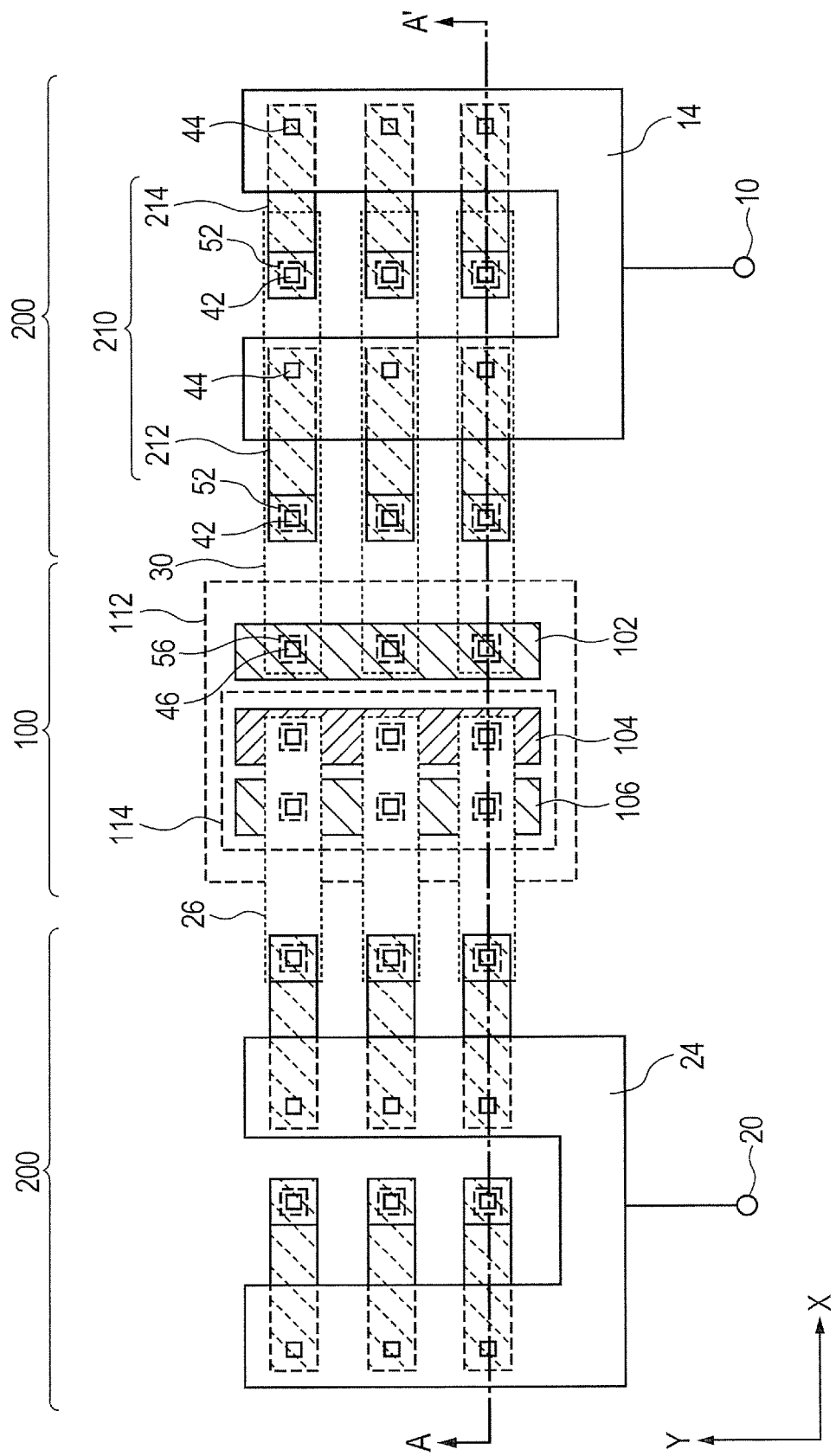
FIG. 18 is a plan view showing a configuration of a protection circuit included in a semiconductor device according to a ninth embodiment.
Figure 19:
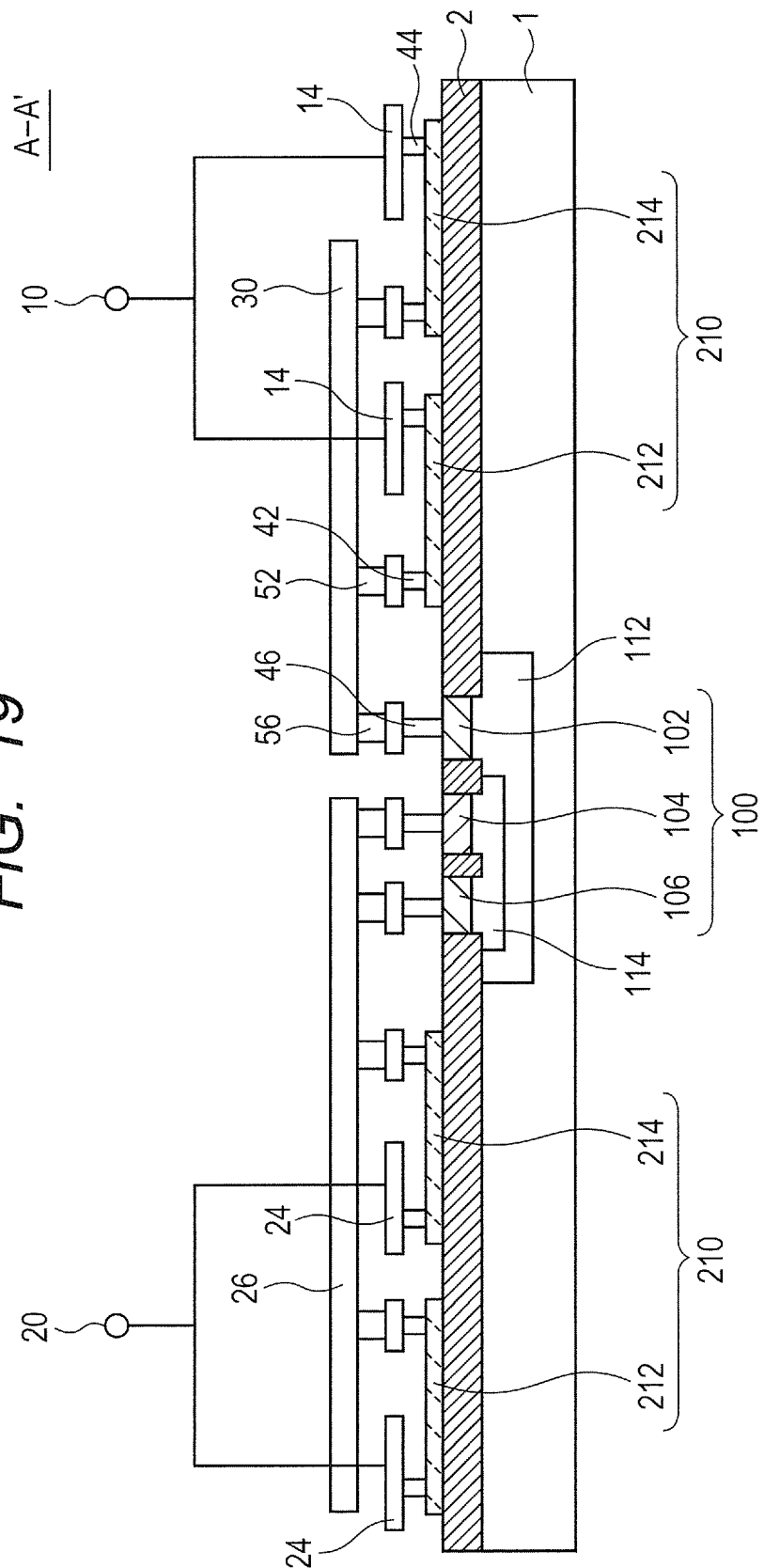
FIG. 19 is a cross-sectional view taken along a line in FIG. 18.
Figure 20:
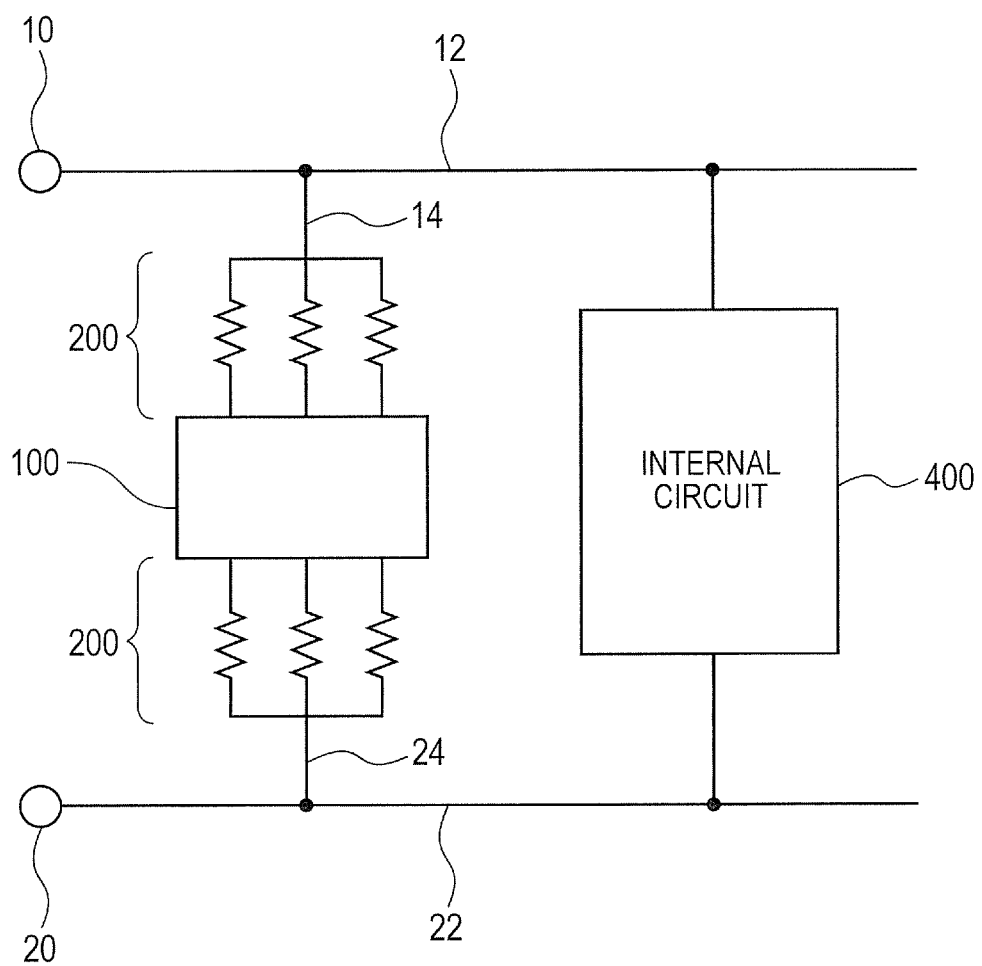
FIG. 20 is a circuit diagram of the semiconductor device shown in FIG. 18.

FIG. 18 is a plan view showing a configuration of a protection circuit included in a semiconductor device according to a ninth embodiment. FIG. 19 is a cross-sectional view taken along a line A-A' in FIG. 18. FIG. 20 is a circuit diagram of the semiconductor device according to the present embodiment. The semiconductor device has the same configuration as that of the semiconductor device according to the first embodiment except that the semiconductor device includes a ballast resistance 200 between the protection element 100 and the second wiring 24. The ballast resistance 200 may have the structures described in the second to the eighth embodiments. The two ballast resistances 200 may have structures different from each other.

In the present embodiment, the ballast resistance 200 coupled to the second wiring 24 is coupled to the base region 104 and the emitter region 106 of the protection element 100 through the wiring 26. The wiring 26 is provided for each of a plurality of resistances 210. In the present embodiment, the resistance 210, the wiring 30, and the wiring 26 of each of the two ballast resistances 200 extend in the same direction.

Also by the present embodiment, it is possible to obtain the same effect as that of the first embodiment. Further, it is possible to prevent current flowing inside the protection element 100 from concentrating in one portion due to the output side of the protection element 100.

Tenth Embodiment

Figure 21:
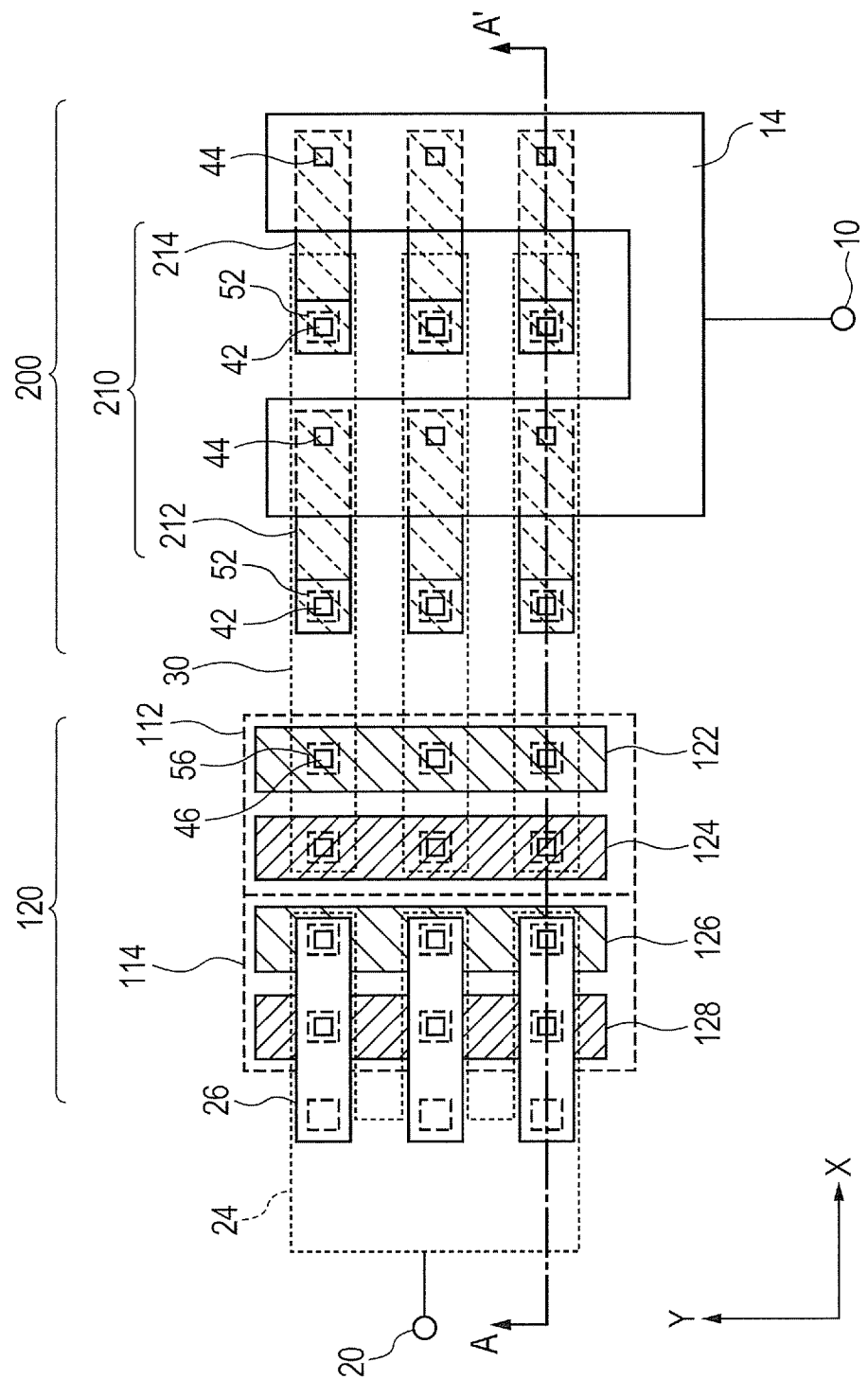
FIG. 21 is a plan view showing a configuration of a protection circuit included in a semiconductor device according to a tenth embodiment.
Figure 22:
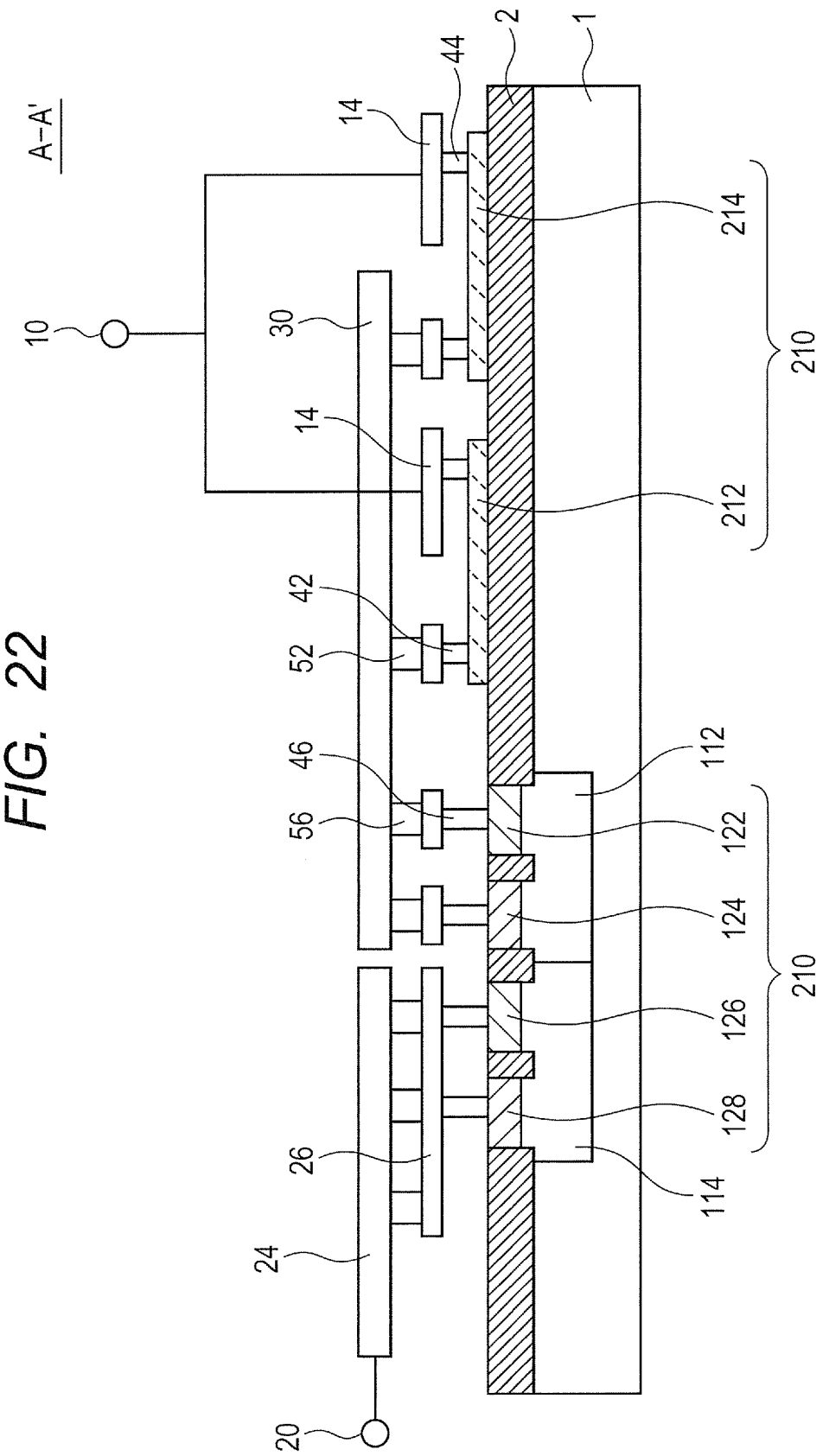
FIG. 22 is a cross-sectional view taken along a line A-A' in FIG. 21.

FIG. 21 is a plan view showing a configuration of a protection, circuit included in a semiconductor device according to a tenth embodiment. FIG. 22 is a cross-sectional view taken along a line A-A' in FIG. 21. The semiconductor device according to the present embodiment has the same configuration as that according to the first or the ninth embodiment except that the semiconductor device has a protection element 120 instead of the protection element 100. FIGS. 21 and 22 show a case similar to the case of the first embodiment. The ballast resistance 200 may have the structures described in the second to the eighth embodiments.

The protection element 120 is a thyristor, which has a configuration in which a second conductivity type layer 122, a first conductivity type layer 124, a second conductivity type layer 126, and a first conductivity type layer 128 are arranged in this order along the first direction (a direction opposite to the X direction in FIG. 21). The second conductivity type layer 122 and the first conductivity type layer 124 are formed in a first well 112 of the first conductivity type (for example, n-type) and the second conductivity type layer 126 and the first conductivity type layer 128 are formed in a second well 114 of the second conductivity type (for example, p-type). In the present embodiment, the first well 112 and the second well 114 are formed in positions adjacent to each other.

The second conductivity type layer 122 and the first conductivity type layer 124 are coupled to the first terminal 10 through the wiring 30, the ballast resistance 200, and the first wiring 14 and the second conductivity type layer 126 and the first conductivity type layer 128 are coupled to the second terminal 20 through the wiring 26 and the second wiring 24.

Also by the present embodiment, it is possible to obtain the same effect as that of the first embodiment. Since the protection element 120 which is a thyristor is applied, it is possible to increase the allowable current amount of the protection element 120.

Eleventh Embodiment

Figure 23:
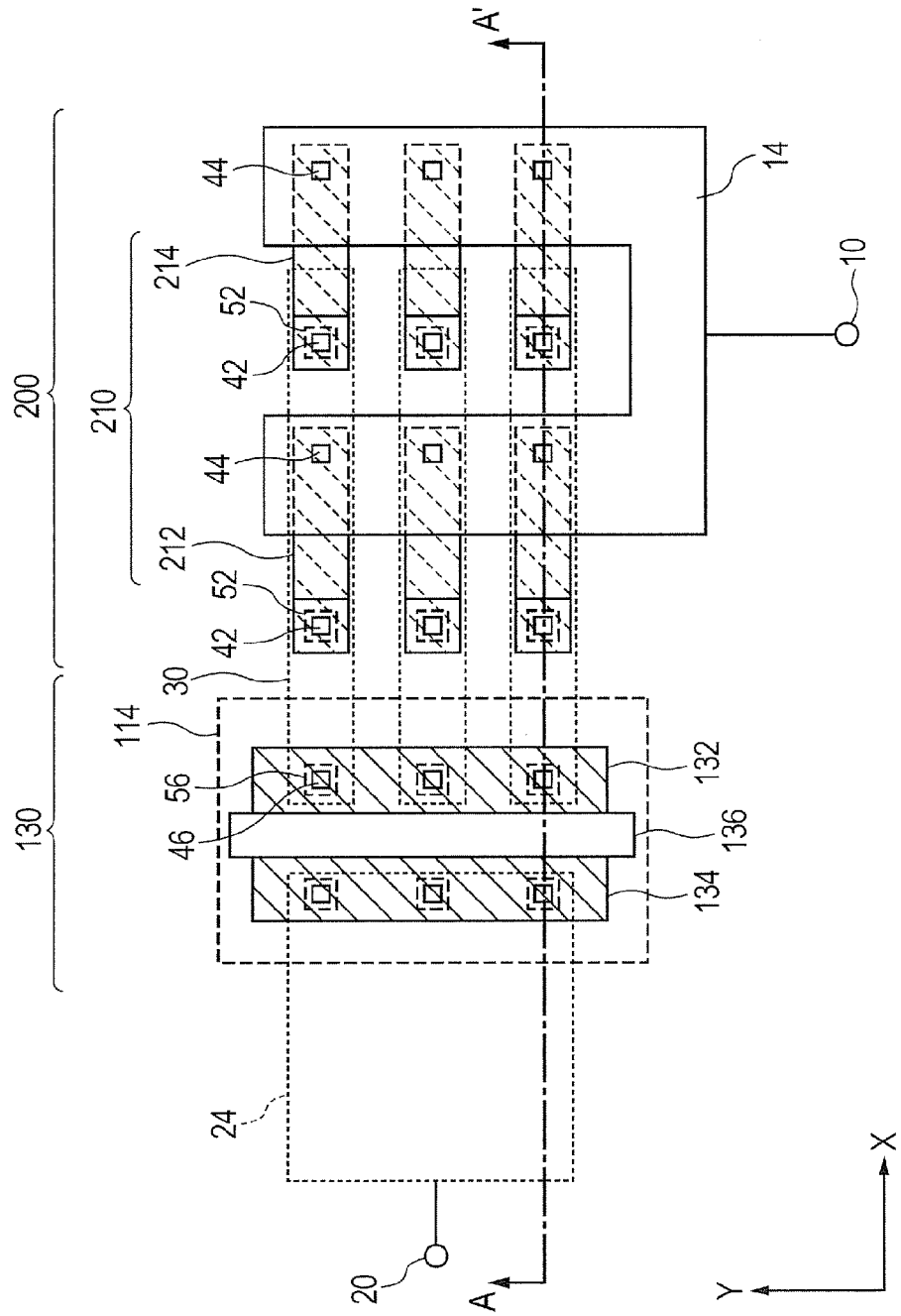
FIG. 23 is a plan view showing a configuration of a protection circuit included in a semiconductor device according to an eleventh embodiment.
Figure 24:
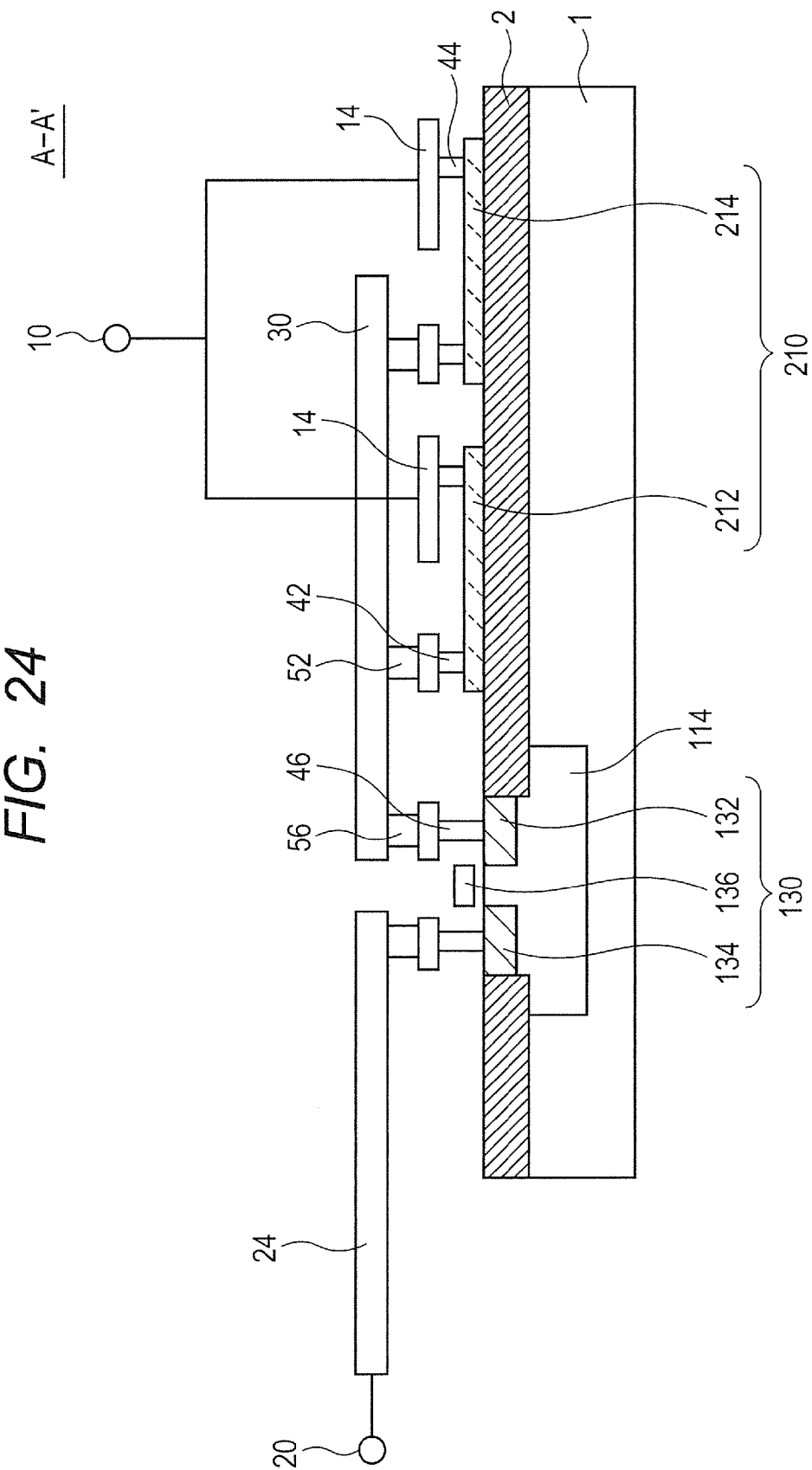
FIG. 24 is a cross-sectional view taken along a line A-A' in FIG. 23.

FIG. 23 is a plan view showing a configuration of a protection circuit included in a semiconductor device according to an eleventh embodiment. FIG. 24 is a cross-sectional view taken along a line A-A' in FIG. 23. The semiconductor device according to the present embodiment has the same configuration as that according to the first or the ninth embodiment except that the semiconductor device has a protection element 130 instead of the protection element 100. FIGS. 23 and 24 show a case similar to the case of the first embodiment. The ballast resistance 200 may have the structures described in the second to the eighth embodiments.

The protection element 130 has the same structure as that of a MOS transistor and includes a drain layer 132 and a source layer 134 of a first conductivity type (for example, n-type) and a gate electrode 136. The drain layer 132 and the source layer 134 are formed in a second well 114 of a second Conductivity type (for example, p-type). The drain layer 132, the gate electrode 136, and the source layer 134 are arranged in this order along a first direction (a direction opposite to the X direction in FIG. 23). In other words, the channel length direction, of the protection element 130 faces the first direction. The drain layer 132 is coupled to the first terminal 10 through the wiring 30, the ballast resistance 200, and the first wiring 14. The source layer 134 is coupled to the second terminal 20 through the second wiring 24. Although not shown in the drawings, a gate insulating film is formed between the gate electrode 136 and the substrate 1. The protection element 130 is formed by the same process as that of the transistor forming the internal circuit 400 (see FIG. 3).

Also by the present embodiment, it is possible to obtain the same effect as that of the first embodiment. The protection element 130 is a MOS transistor, so that the protection element 130 can be formed by the same process as that of the internal circuit. Therefore, no additional process is required.

Twelfth Embodiment

Figure 25:
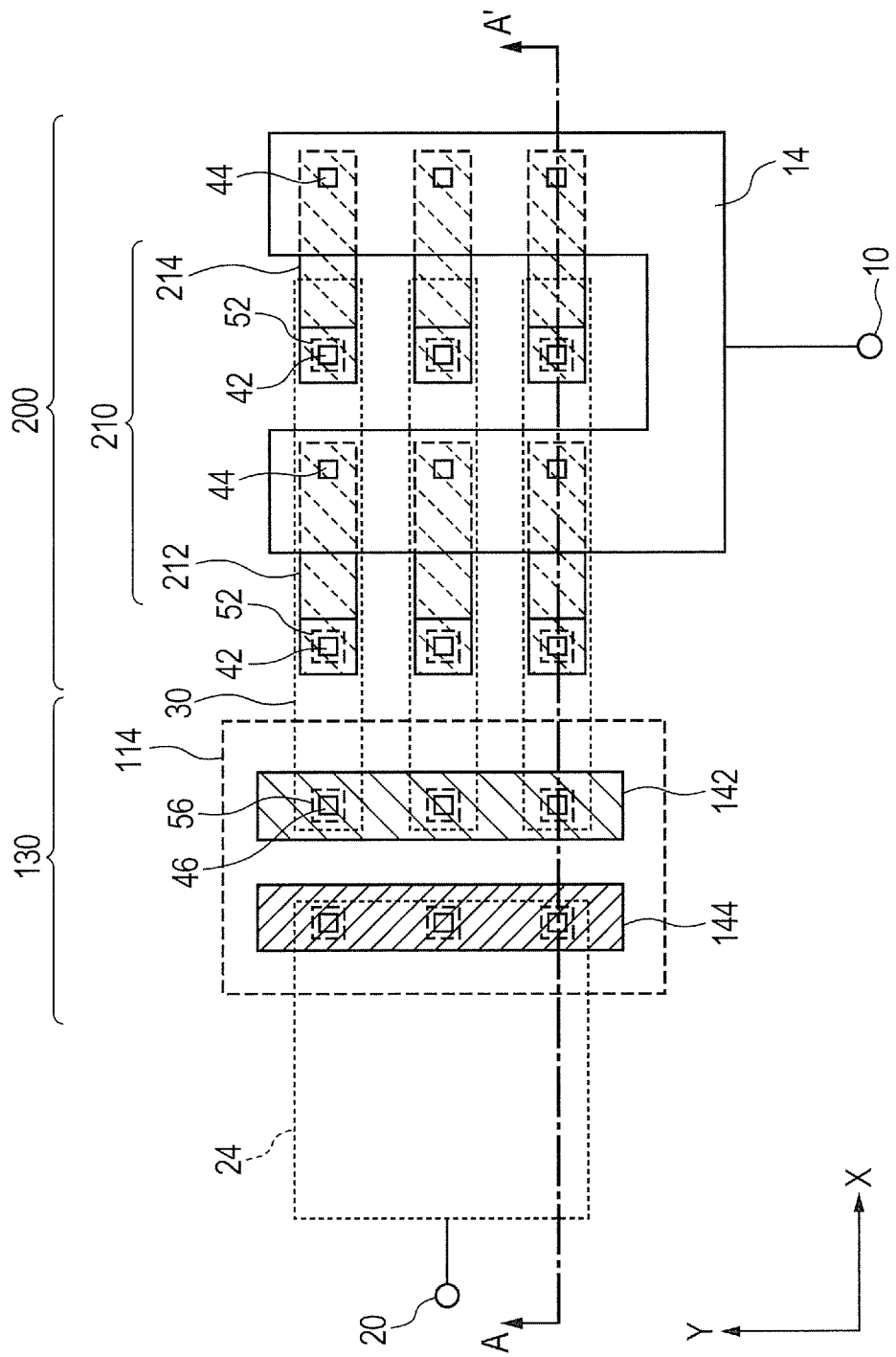
FIG. 25 is a plan view showing a configuration of a protection circuit included in a semiconductor device according to a twelfth embodiment.
Figure 26:
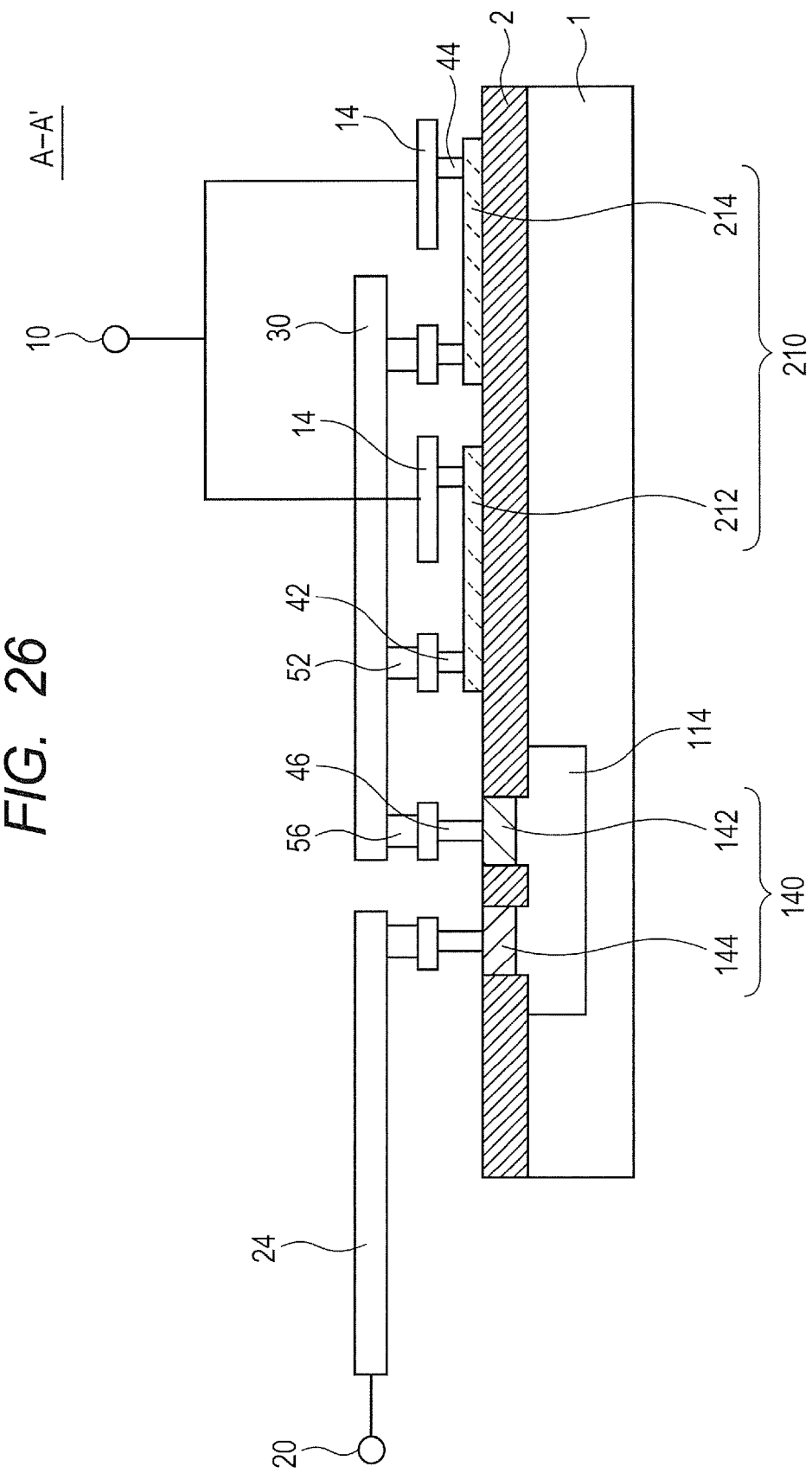
FIG. 26 is a cross-sectional view taken along a line A-A' in FIG. 25.

FIG. 25 is a plan view showing a configuration of a protection circuit included in a semiconductor device according to a twelfth embodiment. FIG. 26 is a cross-sectional view taken along a line A-A' in FIG. 25. The semiconductor device according to the present embodiment has the same configuration as that according to the first or the ninth embodiment except that the semiconductor device has a protection element 140 instead of the protection element 100. FIGS. 25 and 26 show a case similar to the case of the first embodiment. The ballast resistance 200 may have the structures described in the second to the eighth embodiments.

The protection element 140 is a diode and includes a first conductivity type layer 142 and a second conductivity type layer 144. The first conductivity type layer 142 and the second conductivity type layer 144 are formed in a second well 114 of a second conductivity type (for example, p-type). The first conductivity type layer 142 and the second conductivity type layer 144 are arranged along a first direction (the X direction in FIG. 25). The first conductivity type layer 142 is coupled to the first terminal 10 through the wiring 30, the ballast resistance 200, and the first wiring 14. The second conductivity type layer 144 is coupled to the second terminal 20 through the second wiring 24.

Also by the present embodiment, it is possible to obtain the same effect as that of the first embodiment. Further, diode can be used as the protection element 140.

Thirteenth Embodiment

Figure 27:
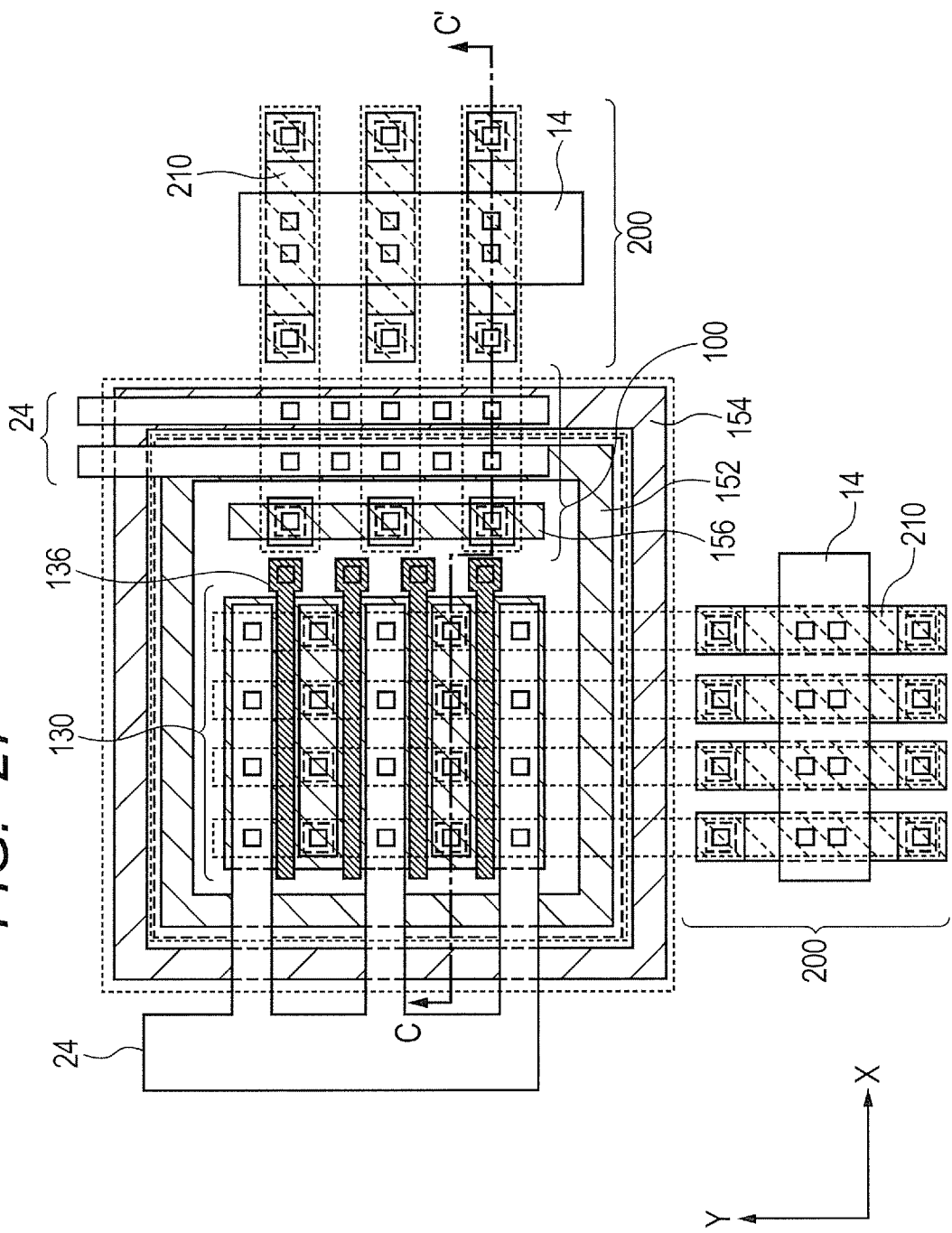
FIG. 27 is a plan view showing a configuration of protection circuit included in a semiconductor device according to a thirteenth embodiment.
Figure 28:
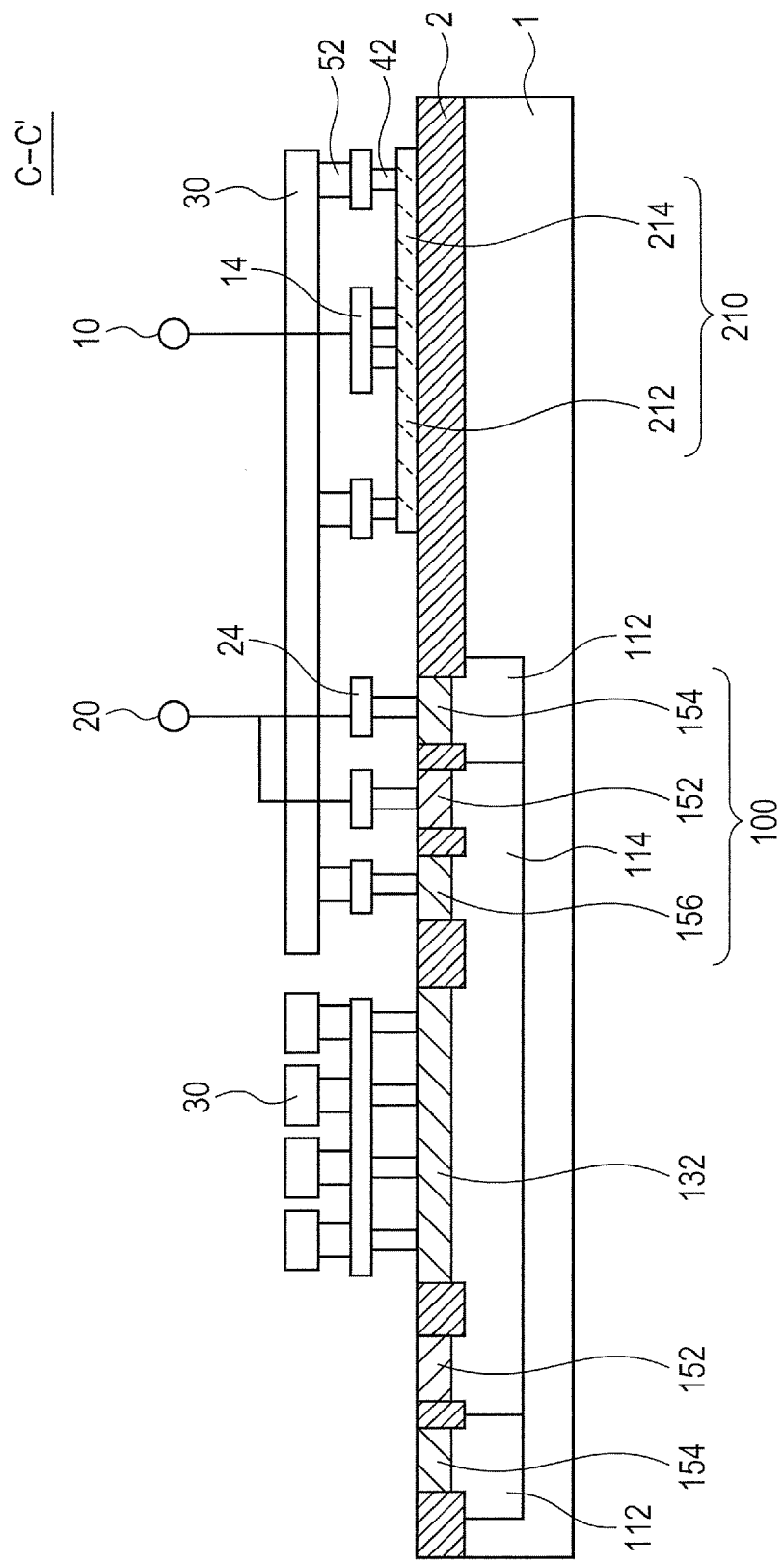
FIG. 28 is a cross-sectional view taken along a line C-C' in FIG. 27.

FIG. 27 is a plan view showing a configuration of a protection circuit included in a semiconductor device according to a thirteenth embodiment. FIG. 28 is a cross-sectional view taken along a line C-C' in FIG. 27. The protection circuit according to the present embodiment includes a protection element 130 and a protection element 100. The ballast resistance 200 is provided between the protection element 130 and the first wiring 14 and between the protection element 100 and the first wiring 14. In FIGS. 27 and 28, the ballast resistance 200 has the structure shown in FIGS. 9 and 10. However, the ballast resistance 200 may have any structure described above.

In the example shown in FIGS. 27 and 28, a second conductivity type layer 152 provided in the second well 114 and a first conductivity type layer 154 provided in the first well 112 surround the protection element 130. The second conductivity type layer 152 is located inside the first conductivity type layer 154.

Specifically, the first well 112 of the first conductivity type and the second well 114 of the second conductivity type are formed in the substrate 1. The first well 112 is formed to surround the second well 114. The protection element 130 and the second conductivity type layer 152 are formed in the second well 114 and the first conductivity type layer 154 is formed in the first well 112. A first conductivity type layer 156 is formed in a portion located between the protection element 130 and the second conductivity type layer 152 in a region surrounded by the second conductivity type layer 152. The first conductivity type layer 156 extends in a direction perpendicular to the gate electrode 136 of the protection element 130. In the protection circuit according to the present embodiment, the first conductivity type layer 156 is added to a protection circuit including the protection element 130 and a guard ring (the second conductivity type layer 152 and the first conductivity type layer 154), so that the protection circuit according to the present embodiment can be assumed to have a structure in which the protection element 100 is added which is formed of a bipolar transistor including the first conductivity type layer 156 as a collector, the second conductivity type layer 152 as a base, and the first conductivity type layer 154 as an emitter.

The wiring 30 which couples the protection element 100 and the ballast resistance 200 together and the wiring 30 which couples the protection element 130 and the ballast resistance 200 together extend in directions perpendicular to each other. The resistance 210 and the wiring 30 coupled to the protection element 100 extend along a direction in which current flows in the protection element 100. Also, the resistance 210 and the wiring 30 coupled to the protection element 130 extend along a direction in which current flows in the protection element 130.

Also by the present embodiment, it is possible to obtain the same effect as that of the first embodiment. Further, it is possible to form another protection element 100 by using the guard ring of the protection element 130.

A case in which the first terminal 10 is an open drain signal terminal will be considered. The open drain signal terminal is used for an output terminal, an input terminal, or an input/ output terminal, to which a voltage higher than or equal to a power supply voltage is assumed to be applied. For example, when it is difficult to provide an ESD protection element such as a diode between a signal terminal and a power supply voltage terminal due to circuit operation, an open drain using an NMOS transistor may be used.

On the other hand, in the protection circuit having the structure of the present embodiment, when the protection element 130 is an NMOS transistor, the second wiring 24 coupled to the protection element 130 is coupled to the ground voltage and the second wiring 24 coupled to the protection element 100 is coupled to the power supply voltage, so that even when a positive over-voltage or a negative over-voltage is applied to the first terminal 10, the over-voltage can be discharged by the protection element 100 or the protection element 130.

Although the embodiments of the present invention have been described with reference to the drawings, these embodiments are examples of the present invention and various configurations other than the above can be employed.

What is claimed is:

1. A semiconductor device comprising:
   a protection element; and
   a ballast resistance coupled to the protection element,
   wherein at least one of a plurality of resistances included in the ballast resistance includes
      a plurality of first resistance elements extending in a first direction in which current flows in the protection element; and
      a second resistance element which is coupled in parallel to the first resistance element and extends in the first direction.

2. The semiconductor device according to claim 1, wherein the second resistance element and the first resistance element extend on the same straight line.

3. The semiconductor device according to claim 1, wherein each of the resistances included in the ballast resistance includes the first resistance element and the second resistance element.

4. The semiconductor device according to claim 3, wherein planar shapes of the first resistance elements are the same and planar Shapes of the second resistance elements are the same.

5. The semiconductor device according to claim 4, wherein planar shapes of the first resistance elements and the second resistance elements are the same.

6. The semiconductor device according to claim wherein the first resistance elements and the second resistance elements are located in the same layer.

7. The semiconductor device according to claim 3, wherein as seen in a direction perpendicular to the first direction, the first resistance elements and the second resistance elements are located inside a portion in which current flows in the protection element.

8. The semiconductor device according to claim 1, wherein the protection element includes a bipolar transistor and the first direction is a direction in which a collector, a base, and an emitter are arranged.

9. The semiconductor device according to claim wherein the protection element includes a MOS transistor and the first direction is a channel length direction of the MOS transistor.

10. The semiconductor device according to claim 1, wherein the protection element includes a thyristor and the first direction is a direction in which a plurality of diffusion layers included in the thyristor are arranged.

11. The semiconductor device according to claim 1,
    wherein one resistive element is formed by the first resistance element and the second resistance element,
    wherein the semiconductor device includes
       an input contact coupled to a portion other than end portions of the resistive element;
       a first output contact coupled to a first end portion of the resistive element; and
       a second output contact coupled to a second end portion of the resistive element,
    wherein a portion of the resistive element, which is located between the input contact and the first end portion, is the first resistance element, and
    wherein a portion of the resistive element, which is located between the input contact and the second end portion, is the second resistance element.

* * * * *